(12) United States Patent
Cok

(10) Patent No.: US 6,692,094 B1
(45) Date of Patent: Feb. 17, 2004

(54) APPARATUS AND METHOD OF MATERIAL DEPOSITION USING COMPRESSED FLUIDS

(75) Inventor: Ronald S. Cok, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 1 day.

(21) Appl. No.: 10/201,506

(22) Filed: Jul. 23, 2002

(51) Int. Cl.[7] .............. B41J 29/38; B41J 2/015
(52) U.S. Cl. .............. 347/5; 347/21; 347/19; 347/85; 347/20
(58) Field of Search .............. 347/5, 101, 100, 347/21, 85, 86, 14, 19, 20

(56) References Cited

U.S. PATENT DOCUMENTS

| | | |
|---|---|---|
| 4,013,502 A | 3/1977 | Staples |
| 4,218,532 A | 8/1980 | Dunkleberger |
| 4,582,731 A | 4/1986 | Smith |
| 4,734,227 A | 3/1988 | Smith |
| 4,737,384 A | 4/1988 | Murthy et al. |
| 5,545,307 A | 8/1996 | Doss et al. |
| 6,325,480 B1 * | 12/2001 | Moghadam et al. ........... 347/5 |
| 6,457,797 B1 * | 10/2002 | Van Der Meijs et al. ..... 347/14 |
| 6,471,327 B2 * | 10/2002 | Jagannathan et al. ......... 347/21 |
| 6,595,630 B2 * | 7/2003 | Jagannathan et al. ......... 347/85 |

OTHER PUBLICATIONS

Pending U.S. patent application Ser. No. 09/794,671, filed Feb. 27, 2001, entitled Apparatus and Method Of Delivering A Focused Beam Of A Thermodynamically Stable/Metastable Mixture Of A Functional Material In A Dense Fluid Onto A Receiver, in the name of Jagannathan et al.

Pending U.S. patent application Ser. No. 09/903,883, filed Jul. 12, 2001, entitled Method And Apparatus For Controlling Depth Of A solvent Free Functional Material In A Reciever, in the name of Jagannathan et al.

\* cited by examiner

Primary Examiner—Stephen D. Meier
Assistant Examiner—Manish Shah
(74) Attorney, Agent, or Firm—William R. Zimmerli

(57) ABSTRACT

A system and method of depositing a functional material on a receiver is provided. The system includes a chamber containing fluid in a compressed state. The fluid includes a solvent and suspension of the functional material to be deposited on the receiver. The chamber has a controllable nozzle for the ejection of a stream of the fluid toward the receiver. The system also includes a controllable platform for locating and orienting the receiver with respect to the controllable nozzle and a controller operably connected to the controllable nozzle and the controllable platform that controls the ejection of the compressed fluid through the controllable nozzle and the location of the receiver with respect to the controllable nozzle. The functional material becomes free of the solvent prior to the functional material contacting the receiver.

42 Claims, 18 Drawing Sheets

APPARATUS AND METHOD OF MATERIAL DEPOSITION USING COMPRESSED FLUIDS

CROSS REFERENCE TO RELATED APPLICATIONS

Reference is made to pending U.S. Ser. No. 09/794,671, entitled Apparatus And Method Of Delivering A Focused Beam of A Thermodynamically Stable/Metastable Mixture Of A Functional Material In A Dense Fluid Onto A Receiver, filed on Feb. 27, 2001, in the name of Ramesh Jagannathan et al., and U.S. Ser. No. 09/903,883, entitled Method and Apparatus For Controlling Depth Of A Solvent Free Functional Material In A Receiver, filed on Jul. 12, 2001, in the name of Ramesh Jagannathan et al.

FIELD OF THE INVENTION

The present invention relates to material deposition, generally, and more specifically to the patterned deposition of materials on a surface through the use of material suspended in a compressed state and ejected in a thin stream onto the surface.

BACKGROUND OF THE INVENTION

Systems for the deposition of material upon surfaces are fundamental to the construction of integrated circuits and optical systems. Integrated circuit construction is usually based upon photo-lithographic techniques wherein flat surfaces (such as wafers) are exposed to ultra-violet light, sputtering, or chemical vapors through a mask. Other techniques rely on the use of charged particle beams for implanting materials at specific locations. The beams may be steered through the use of electromagnetic fields. Materials may be deposited upon optical elements through, for example liquid coating and vapor deposition. Structures on optical surfaces may be created, for example by etching or mechanical cutting and polishing.

Processes that enable patterned deposition of materials onto a substrate have a number of applications, especially in the electronic microcircuit industry. Micro-fabrication of electronic circuits relies on the ability to create multi-layer patterns of numerous functional materials, with varying electrical properties. The technologies used for creating these multi-layer patterns may be additive, subtractive or a combination of the two: Additive technologies deposit the functional material on the substrate in the desired pattern; i.e., the pattern is generated directly on the substrate during the deposition/layering process, while subtractive processes first create a continuous layer of the functional material on the substrate and the desired pattern is then subsequently created by the selective removal of functional material from the deposited layer; i.e., the pattern is created subsequent to the deposition/layering process. A detailed description of various patterned deposition/layering processes used in the microfabrication industry may be found in "The Physics of Micro/Nano-Fabrication," Ivon Brodie and Julius J. Murray, Plenum Press, NY, 1992.

Traditional microfabrication processes utilize either or both the additive and subtractive processes depending upon the specific application, and are generally carried out in a high vacuum (low pressure) environment. The high vacuum process generally involves the evaporation of functional material by beating or by ion bombardment followed by deposition on the substrate by condensation or by a chemical reaction. A feature common to all these processes is that the functional material to be deposited has to be thermally stable or has to have a thermally stable precursor that can generate the function material on the substrate by a chemical reaction. These processes are not useful in generating patterned layers of thermally unstable materials.

It is common in the art to use a mask technique for patterned deposition. Typically, the mask employed for patterning on a planar substrate surface is a photo-resist material. However, when the surface is non-planar, difficulties can be encountered in depositing and cleaning off the photo-resist material, necessitating the use of shadow masks or stencils. For example, Dunkleberger in U.S. Pat. No. 4,218,532 describes a method for patterned deposition of thin films of metals such as lead alloys by vacuum evaporation onto a substrate through openings in a mask that is fabricated with a predetermined pattern. There is a problem with this technology however, in that it cannot be used for the patterned deposition of thermally unstable materials since these are not suitable for vacuum evaporation. Staples in U.S. Pat. No. 4,013,502 describes a process for high resolution pattern replication using stencils, where the stencil is used as a mask in molecular beam deposition of thin films of materials onto a substrate through the openings in the stencil, where the molecular beam source is a E-beam evaporator. There is a problem with this technology also in that it cannot be used for patterned deposition of thermally unstable materials that are not suitable for evaporation using an E-beam. Moreover, use of photolithographic techniques renders the use of non-planar substrates problematic since maintaining a high-resolution focus is difficult.

Patterned deposition of thermally unstable materials on substrates may be achieved by liquid phase processes such as electroplating, electrophoresis, sedimentation, or spin coating but these processes are system specific. For example, in the case of electroplating, it is necessary that an electrochemically active solution of the functional material precursor is available. In the case of sedimentation and spin coating, a stable colloidal dispersion is necessary. In the case of electrophoresis, it is also necessary that the stable colloidal dispersion be charged. Micro-fabrication of multi-layer structures usually requires multiple stages, necessitating the complete removal of residual liquids/solvents at the end of every stage, which can be very energy, time, and cost intensive. Further, many of these liquid-based processes require the use of non-aqueous liquids/solvents, which are hazardous to health and the disposal of which can be prohibitively expensive. For example, Doss et al. in U.S. Pat. No. 5,545,307 disclose a process for patterned electroplating of metals onto a substrate through a mask. This technology has two major problems in that it is only applicable to materials that have electrochemically active precursors and it uses an aqueous electroplating bath for the process, requiring that the coated substrate is cleaned and dried at the end of the coating process.

To eliminate the need for potentially harmful solvents that need drying, it is possible to use environmental and health-benign supercritical or dense-phase fluids such as carbon dioxide as solvents. For example, Murthy et al. in U.S. Pat. No. 4,737,384 disclose a process for depositing thin films of materials that are soluble in supercritical fluids onto a substrate. The process of this invention comprises of the steps of: exposing a substrate at supercritical temperatures and pressures to a solution comprising of a metal or polymer dissolved in water or a non-polar organic solvent, said metal or polymer being substantially insoluble in said solvent under sub-critical conditions and being substantially soluble in said solvent under supercritical conditions; and reducing the pressure, or temperature and pressure to sub-critical values, thereby depositing a thin coating of said metal or polymer on said substrate. There is a problem with this technology in that it only applies to materials that can be dissolved in supercritical fluids, severely limiting the choice of materials that can be deposited on a substrate using this technology. Further, this patent does not teach a process for the patterned deposition of functional materials. Smith in U.S. Pat. Nos. 4,582,731 and 4,734,227 also discloses processes for the creation of solid films by dissolving a solid material into supercritical fluid solution at an elevated pressure and then rapidly expanding the solution through a heated nozzle having a short orifice into a region of relatively low pressure. These processes suffer from the same problem in that they are only applicable to materials that are soluble in supercritical fluids and do not teach a process for patterned deposition. Moreover, the processes are not readily applied to curved surfaces, such as optical elements.

Components with curved surfaces are common-place in optical systems. Display applications that rely on a conversion of a flat, planar wave front to a curved surface, or vice versa, are difficult to implement because devices to convert planar to curved wave-fronts suffer from a number of problems. For example, fiber plates may induce a perceptible hexagonal pattern overlaid on the display and curved diffusive elements are difficult to manufacture without creating anomalies in the display. By placing optically active materials upon the curved surface of an optical element, these problems may be obviated. However, there is a problem in that no suitable technique for the deposition of the materials upon curved surfaces.

There is a need, therefore, for a patterned deposition technique that permits the patterned deposition materials onto curved surfaces or substrates. There is a further need for a technique for the patterned deposition of thermally unstable/labile materials that eliminates the use of expensive, and environmentally and human health-hazardous solvents, the need for post-deposition drying for solvent-elimination and is applicable for a wide range of functional materials and that is not limited by specific properties of the functional materials.

SUMMARY OF THE INVENTION

According to a feature of the present invention, a system for depositing a functional material on a receiver includes a chamber containing fluid in a compressed state. The fluid includes a solvent and suspension of the functional material to be deposited on the receiver. The chamber has a controllable nozzle for the ejection of a stream of the fluid toward the receiver. The system also includes a controllable platform for locating and orienting the receiver with respect to the controllable nozzle and a controller operably connected to the controllable nozzle and the controllable platform thereby controlling the ejection of the compressed fluid through the controllable nozzle and controlling the location of the receiver with respect to the controllable nozzle. The functional material becomes free of the solvent prior to the functional material contacting the receiver.

According to another feature of the present invention, a method of delivering a functional material to a receiver includes providing a chamber containing fluid in a compressed state, the fluid including a solvent and suspension of functional material to be deposited; providing a controllable nozzle integrated into the chamber for the ejection of the fluid in a stream; locating one of a receiver and the controllable nozzle with respect to the other of the receiver and the controllable nozzle such that the receiver is positioned to intersect the stream of functional material; and controllably ejecting the fluid through the nozzle, wherein the functional material becomes free of the solvent prior to contacting the receiver.

BRIEF DESCRIPTION OF THE DRAWINGS

In the detailed description of the embodiments of the invention presented below, reference is made to the accompanying drawings, in which.

DETAILED DESCRIPTION OF THE INVENTION

Figure 2:
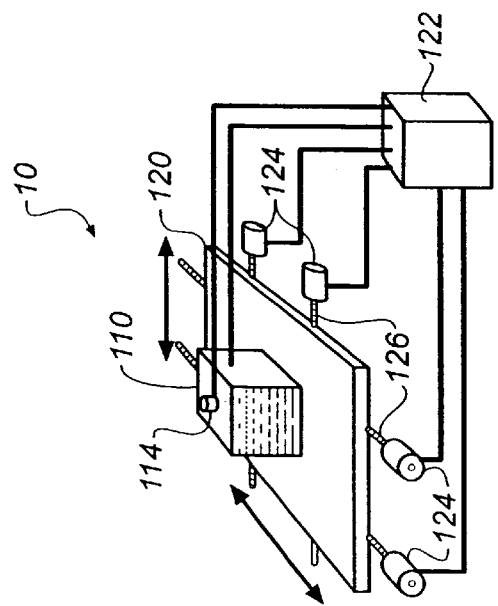
FIG. 2 is a schematic view of a second embodiment made in accordance with the present invention.

The present description will be directed in particular to elements forming part of, or cooperating more directly with, apparatus in accordance with the present invention. It is to be understood that elements not specifically shown or described may take various forms well known to those skilled in the art.

Referring to FIGS. 1–7, a system 10 for the deposition of materials on a receiver having an arbitrary surface is shown. The system 10 includes a chamber 110 containing a compressed fluid and a controllable nozzle 114 for the ejection of the fluid in a stream 116, the fluid including a suspension of functional material to be deposited. A receiver and/or the controllable nozzle is mounted on a controllable platform 120 for positioning locations on the receiver to intersect with the stream 116 of functional material. The system 10 also includes a controller 122 for controlling the controllable platform 120 and the ejection of fluid from the controllable nozzle 114. Embodiments of the system will now be discussed.

Referring to FIG. 1, a chamber 110 containing a compressed fluid 112 with a functional material in suspension has a controllable nozzle 114 for ejecting the fluid under controlled conditions. The fluid is ejected into a thin stream 116 that contacts a receiver 118. The receiver 118 may be mounted upon a controllable platform 120 with mechanical alignment devices such as stepper motors 124 under the control of a controller 122. The controller 122 also controls the controllable nozzle 114 and chamber environment.

After the functional material is suitably suspended in a compressed fluid, it is ejected through the nozzle 114 in the chamber 110. The nozzle 114 is controlled by the controller 122 and is operated to allow the compressed fluid 112 to eject. As the fluid ejects, it undergoes a phase change and evaporates, leaving the desired functional material traveling toward the receiver 118. When the functional material strikes the receiver 118 it is deposited at the specific point of intersection. By carefully controlling the length of time that the nozzle is open, the amount of material deposited at that point may be precisely controlled. When the appropriate amount of material is deposited, the controllable nozzle 114 may be closed and the controllable platform 120 operated to move the receiver 118 so that another point will intersect a subsequent stream of functional material. Generally, the surface of receiver 118 at the point of intersection is normal to the thin stream of material 116. However, different deposition profiles may be obtained by placing the receiver 118 at an angle to the stream of material 116.

Sequential deposition of small amounts of functional material at many points on a surface of the receiver 118 may take a long time. The process may be accelerated by employing a chamber with multiple nozzles under independent control by the controller. The nozzles may direct functional material to a common location on the receiver or, alternatively, the functional material may be directed to different locations on the receiver. In another embodiment, multiple chambers with different functional materials in suspension may be employed to deposit different functional materials on the same receiver in a step-and-repeat fashion. Typically, the functional materials will be deposited in different locations. This process of step-and-repeat is well known in the integrated circuit manufacturing industry. The process may be extended to depositing functional materials over a receiver (either one-dimensional—a line, or two-dimensional—an area) by continuously ejecting functional material from the nozzles while simultaneously moving the receiver. By carefully controlling the rate of movement of the receiver and functional material ejection, the system may draw features upon the receiver. Moreover, by sequentially depositing different materials at the same location on the receiver, multiple layers of functional material can be deposited on the receiver.

Figure 1:
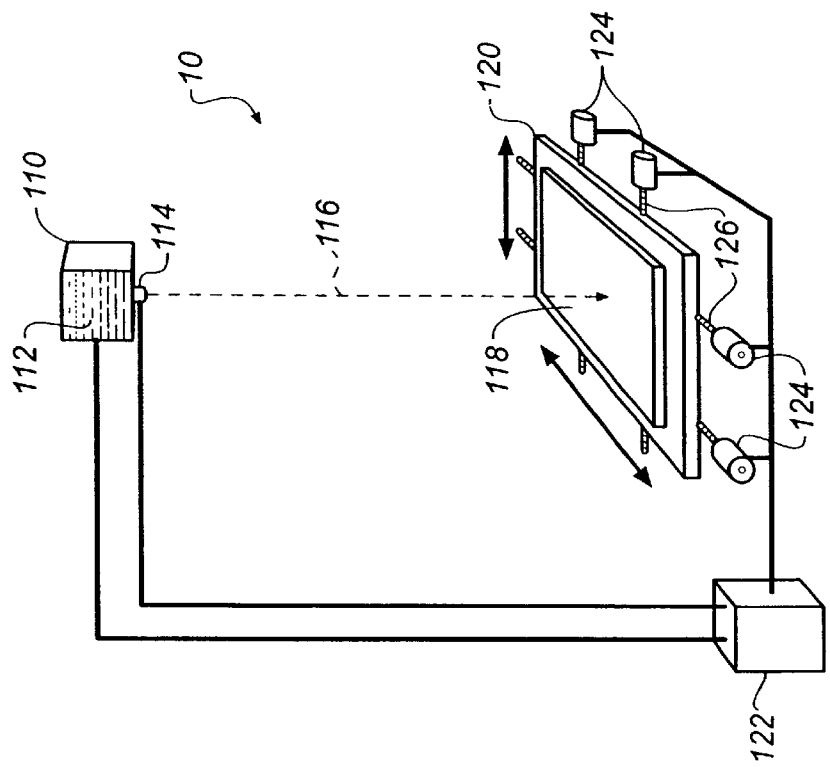
FIG. 1 is a schematic view of a first embodiment made in accordance with the present invention.

Relative movement of the receiver with respect to the stream of compressed fluid may be accomplished in a variety of ways depending on the nature of the receiver and the patterns deposited. In one embodiment, useful for rigid planar receivers, the position of the controllable nozzle and the stream of compressed fluid are fixed. The receiver is placed upon a controllable platform or platen that can be moved in two dimensions (as shown in FIG. 1). The controllable platform can be moved under the control of the controller, typically through the use of stepper motors driving orthogonally positioned worm gears 126. Linear actuators may also be used if the movement needed is limited to small distances of a few centimeters. Other conventional mechanical movements may be employed as well, for example, rack and pinion movements. Alternatively, the controllable nozzle can be moved rather than the receiver using a similar control mechanism (as shown in FIG. 2). Referring to FIG. 2, a chamber 110 having a controllable nozzle 114 are mounted upon a controllable platform 120 moved by stepper motors 124 with worm gears 126.

Figure 3:
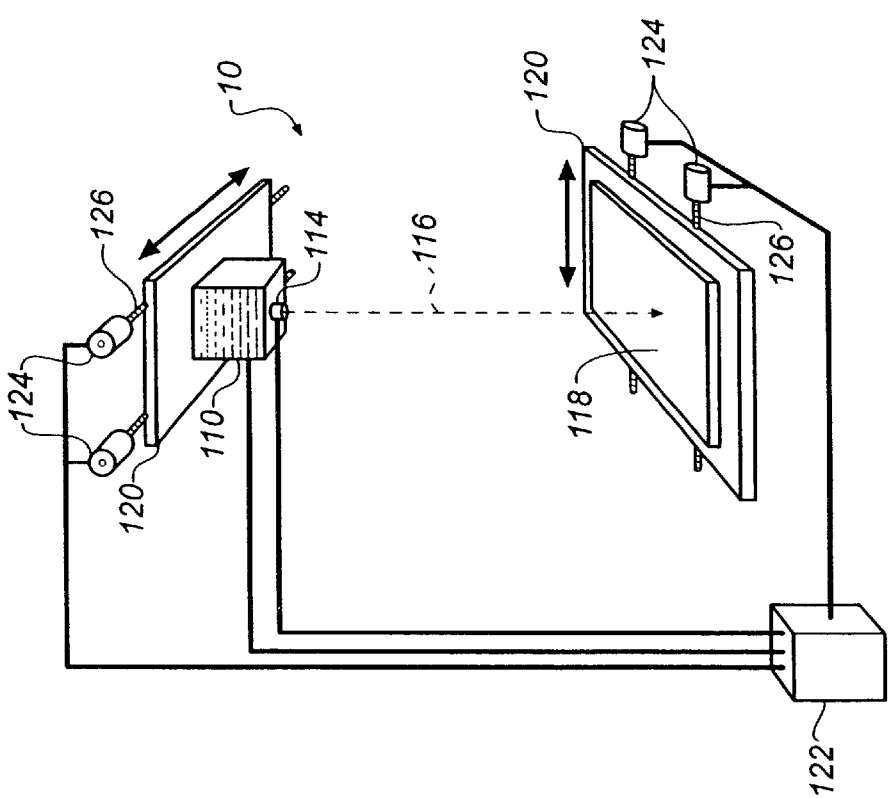
FIG. 3 is a schematic view of a third embodiment made in accordance with the present invention.

In another embodiment, the controllable nozzle moves in one dimension (for example, the x direction), while the receiver is moved in the other dimension (for example, the y direction) (FIG. 3). In this embodiment, the controllable platform is distributed in two mechanisms, one associated with the chamber and the other with the receiver. This has the advantage of simplifying the translation mechanisms. In all these cases, it is possible to move either the receiver or controllable nozzle bidirectionally to minimize actual movement, as is well known, for example, with ink jet deposition systems. A further embodiment of the present invention, the receiver has a planar surface and the controllable platform includes means to rotate the platform in the plane of the receiver's surface to enable the deposition of functional materials in curved patterns on the receiver. This can be accomplished by placing the controllable platform on a bearing assembly and rotating the controllable platform about a point using conventional stepper motors and gearing.

Figure 4:
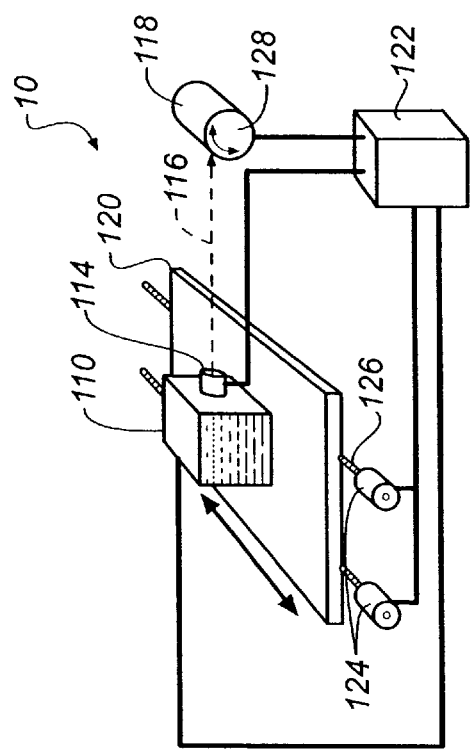
FIG. 4 is a schematic view of a fourth embodiment made in accordance with the present invention.

If the receiver is not planar, the mechanism for moving the receiver may be more complex. For receivers that are curved in only one dimension, for example a conventional cylinder, the receiver can be mounted upon a controllable platform whose surface has a similar curvature and then rotated about the center of curvature of the cylinder (as shown in FIG. 4). Referring to FIG. 4, a chamber 110 having a controllable nozzle 114 is mounted upon a controllable platform 120 so as to direct a stream of functional material 116 to contact a receiver 118 mounted upon a cylindrically curved controllable platform 128. The controllable nozzle 114 and stream of compressed fluid 116 are then translated parallel to the receiver surface as described above to deposit functional material on the curved surface. The cylindrically curved controllable platform 128 can be rotated about its axis in either a forward or backward direction to provide material deposition in either direction. This can be accomplished using a stepper motor to rotate the controllable platform 128.

Figure 5:
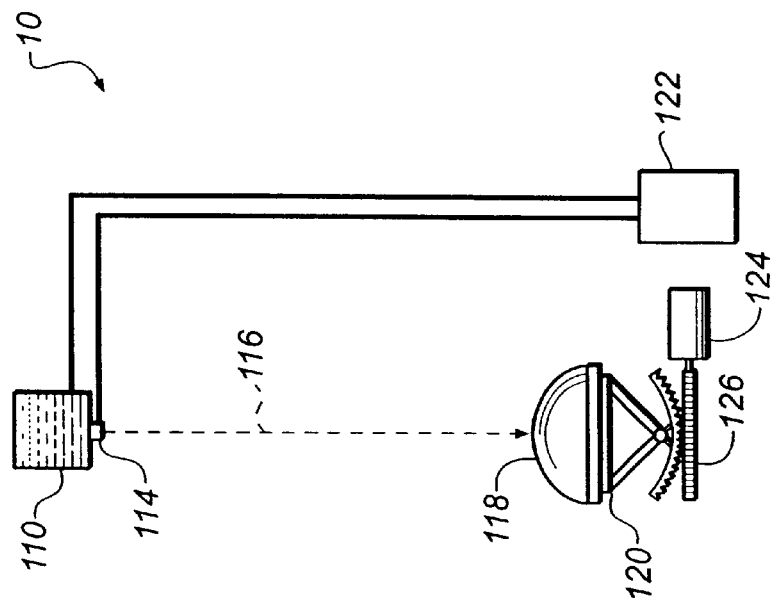
FIG. 5 is a schematic view of a fifth embodiment made in accordance with the present invention.

If the receiver is curved in two dimensions and has a spherical surface, the controllable platform may be rotated about the center of curvature in two orthogonal directions while holding the controllable nozzle stationary. Referring to FIG. 5, an optical element with a spherically curved surface 118 is placed upon a platform 120 which can be rotated about the center of curvature of the optical element. A rack and pinion arrangement 126 is used to rotate the optical surface. Controller 122 controls motors 124 that control the angle of inclination of optical surface 118 while simultaneously maintaining the compressed fluid in chamber 110 and controllably emitting the functional material 116 through nozzle 114.

Figure 6:
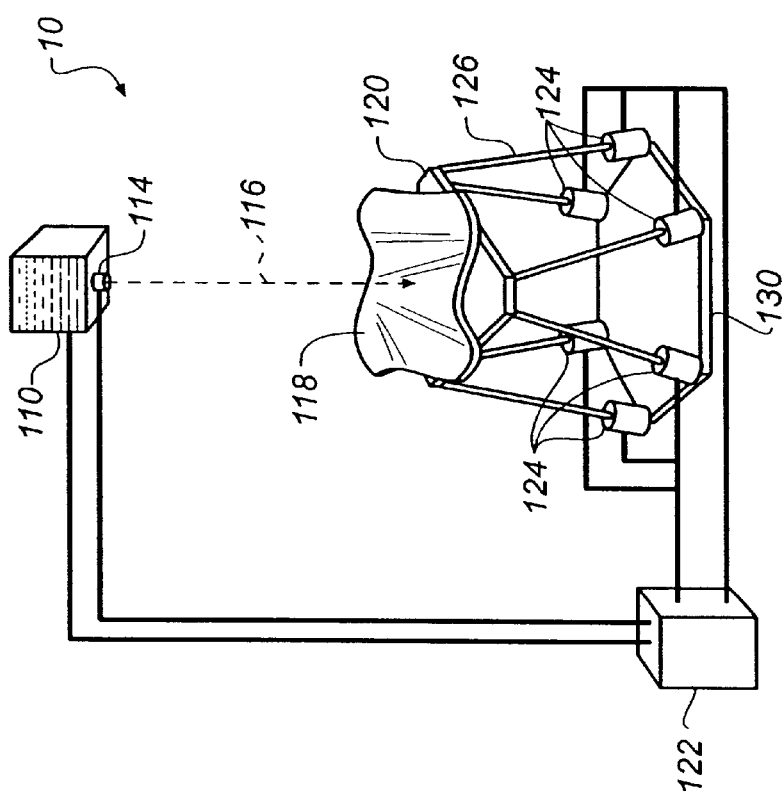
FIG. 6 is a schematic view of a sixth embodiment made in accordance with the present invention.

For more complex curved shapes, for example, an array of optical elements each of which is an independent receiver 118, a receiver having a non-planar surface, the mounting surface may 120 be controlled with a Stewart platform 130 actuated by stepper motors 124 and worm gears 126 or linear actuators (as shown in FIG. 6). Referring to FIG. 6, a chamber 110 having a controllable nozzle 114 eject a stream of functional material to contact a receiver 118 whose surface is arbitrarily curved. The receiver 118 is mounted upon a controllable platform 120 that has six degrees of freedom and is moved by stepper motors 124 and worm gears 126. Any point on the receiver's surface may be placed to intersect with the stationary flow of particles, restricted only by the limitations of the controllable platform 120. The controllable platform 120 may not require six degrees of freedom of motion depending on the nature and complexity of the receiver's surface.

Figure 7:
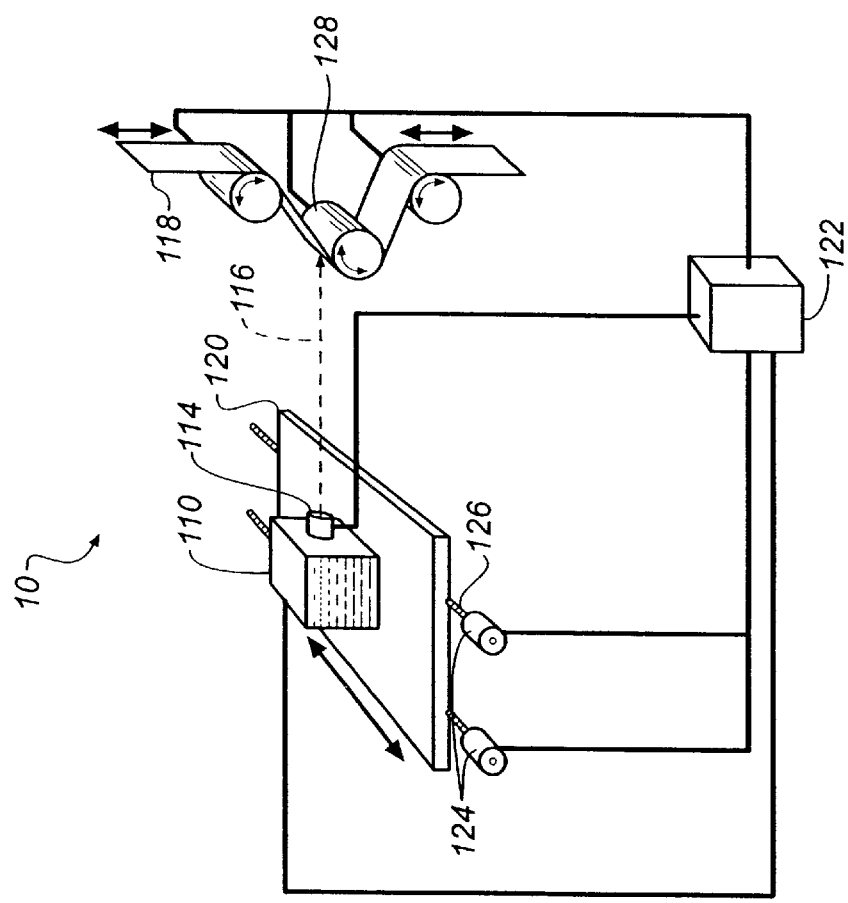
FIG. 7 is a schematic view of a seventh embodiment made in accordance with the present invention.

When the receiver is flexible, for example, a receiver in the form of a sheet or web of a specific width, an indeterminate length of receiver may be passed beneath a controllable nozzle and stream of functional material (as shown in FIG. 7). As the web passes beneath the controllable nozzle, the controllable nozzle moves orthogonally to the motion of the receiver, as described above with reference to FIG. 4. The web may be planar or may be curved around a cylinder with rollers to more carefully control the position of the receiver and may move either forward or backward during deposition of the functional material.

The receiver surface may have materials deposited on it in one or more layers prior to the deposition of functional materials from a compressed fluid. Alternatively, additional materials may be deposited after the functional materials are deposited. For example, a surface may have conductive layers deposited upon it to serve as a conductive layer for conducting electricity to electrically stimulate the functional materials deposited upon the conductive layer. Such layers may be coated by spin or web coating, for example. Moreover, the stream of functional material may penetrate one or more layers in the receiver to deposit functional material in underlying layers.

A great variety of materials may be deposited upon receivers with a variety of surfaces using the present invention. For example, materials can include but are not limited to, light emissive materials, electrically conductive, electrically insulative materials, semiconductive materials, bioactive compounds, marking materials such as dyes, pigments, etc., magnetically responsive materials, chemical compounds, polymeric materials, etc. In particular, organic materials capable of emitting light when a current is passed through them (OLEDs) may be deposited upon a curved surface to create a display device having a curved surface. This surface may be an optical surface. In some optical systems, it is useful to convert a flat, planar wave front to a curved wave front matched to an optical element such as a mirror or curved, diffuse surface. By depositing emissive functional material on a curved surface, the need to convert from a planar wave front to a curved one is obviated by creating the wave front as a curved wave front. This is especially useful when the curved surface is a sphere or a section of a sphere. Functional material may be deposited on either the inside of a sphere section or the outside of a sphere itself. In this case, the controllable platform may move the surface of the receiver about a common point of curvature. Such designs are useful in the creation of display and projection systems.

The present invention may be employed to deposit OLED materials composed of small molecule polymeric OLEDs as disclosed in but not limited to U.S. Pat. No. 4,769,292, issued Sep. 6, 1988 to Tang et al., entitled "Electroluminescent Device with Modified Thin Film Luminescent Zone" and U.S. Pat. No. 5,061,569, issued Oct. 29, 1991 to VanSlyke et al., entitled "Electroluminescent Device with Organic Electroluminescent Medium.

The fluid compression and delivery system will now be described in greater detail. The components of chamber 110 and nozzle 114 are shown and described in FIGS. 8–20D.

Figure 8:
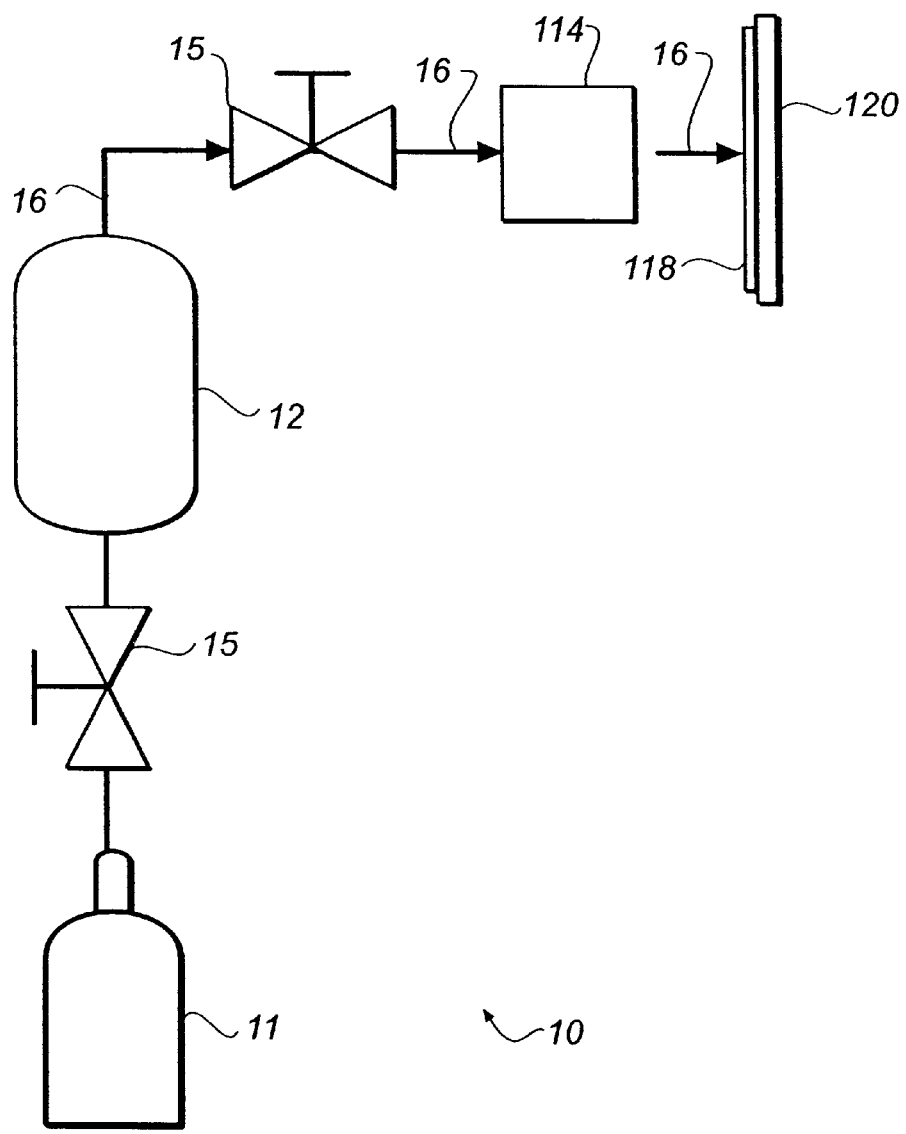
FIG. 8 is a schematic view of a delivery system made in accordance with the present invention.

Referring to FIG. 8, delivery system 10 has components, 11, 12, and 114 that take chosen solvent and/or dispersant materials to a compressed fluid state, with a density>0.1 g/cc make a solution and/or dispersion of an appropriate functional material or combination of functional materials in the chosen compressed fluid, and deliver the functional materials as a collimated and/or focused stream onto a receiver 118 in a controlled manner. Functional materials can be any material that needs to be delivered to a receiver, for example electroluminescent materials, imaging dyes, ceramic nanoparticles etc., to create a pattern on the receiver by deposition, etching, coating, other processes involving the placement of a functional material on a receiver, etc.

In this context, the chosen materials taken to a compressed fluid state with density>0.1 g/cc are gases at ambient pressure and temperature. Ambient conditions are preferably defined as temperature in the range from −100 to +100° C., and pressure in the range from $1 \times 10^{-8}$–100 atm for this application.

In FIG. 8, a schematic illustration of the delivery system 10 is shown. The chamber 110 includes a compressed fluid source 11, a formulation reservoir 12, and valve(s) 15. Nozzle 114 is a discharge device connected in fluid communication along a delivery path 16.

A compressed fluid carrier, contained in the compressed fluid source 11, is any material that dissolves/solubilizes/disperses a functional material. The compressed fluid source 11 delivers the compressed fluid carrier at predetermined conditions of pressure, temperature, and flow rate as a supercritical fluid, or a compressed liquid.

Materials that are above their critical point, defined by a critical temperature and a critical pressure, are known as supercritical fluids. The critical temperature and critical pressure typically define a thermodynamic state in which a fluid or a material becomes supercritical and exhibits gas like and liquid like properties. Materials that are at sufficiently high temperatures and pressures below their critical point may exist as compressed gases or liquids. We describe compressed fluids as materials that are in any one of these three (gas, liquid or supercritical) states with a density$\geq$0.1 g/cc. Also, materials in their compressed fluid state with density>0.1 g/cc and exist as gases at ambient conditions (defined) find application here because of their unique ability to solubilize and/or disperse functional materials of interest in the compressed fluid state.

Fluid carriers include, but are not limited to, carbon dioxide, nitrous oxide, ammonia, xenon, ethane, ethylene, propane, propylene, butane, isobutane, chlorotrifluoromethane, monofluoromethane, sulphur hexafluoride and mixtures thereof. Due to its characteristics, e.g. low cost, wide availability, etc., carbon dioxide is generally preferred in many applications.

The formulation reservoir 12 is utilized to dissolve and/or disperse functional materials in compressed fluids with or without dispersants and/or surfactants, at desired formulation conditions of temperature, pressure, volume, and concentration. The combination of functional material and compressed fluid is typically referred to as a mixture, formulation, etc.

The formulation reservoir 12 can be made out of any suitable materials that can safely operate at the formulation conditions. An operating range from 0.001 atmosphere ($1.013 \times 10^2$ Pa) to 1000 atmospheres ($1.013 \times 10^8$ Pa) in pressure and from −25 degrees Centigrade to 1000 degrees Centigrade is generally preferred. Typically, the preferred materials include various grades of high-pressure stainless steel. However, it is possible to use other materials if the specific deposition or etching application dictates less extreme conditions of temperature and/or pressure.

The formulation reservoir 12 should be precisely controlled with respect to the operating conditions (pressure, temperature, and volume). The solubility/dispersibility of functional materials depends upon the conditions within the formulation reservoir 12. As such, small changes in the operating conditions within the formulation reservoir 12 can have undesired effects on functional material solubility/dispensability.

Additionally, any suitable surfactant and/or dispersant material that is capable of solubilizing/dispersing the functional materials in the compressed fluid for a specific application can be incorporated into the mixture of functional material and compressed fluid. Such materials include, but are not limited to, fluorinated polymers such as perfluoropolyether, siloxane compounds, etc.

The receiver 118 can be positioned on a controllable platform 120 that is used to control the location of the receiver 118 relative to the nozzle 114 during the operation of the delivery system 10.

Referring to FIGS. 9–12, alternative embodiments of the delivery system 10 as shown FIG. 8 are described. In each of these embodiments, individual components are in fluid communication, as is appropriate, along the delivery path 16.

Figure 9:
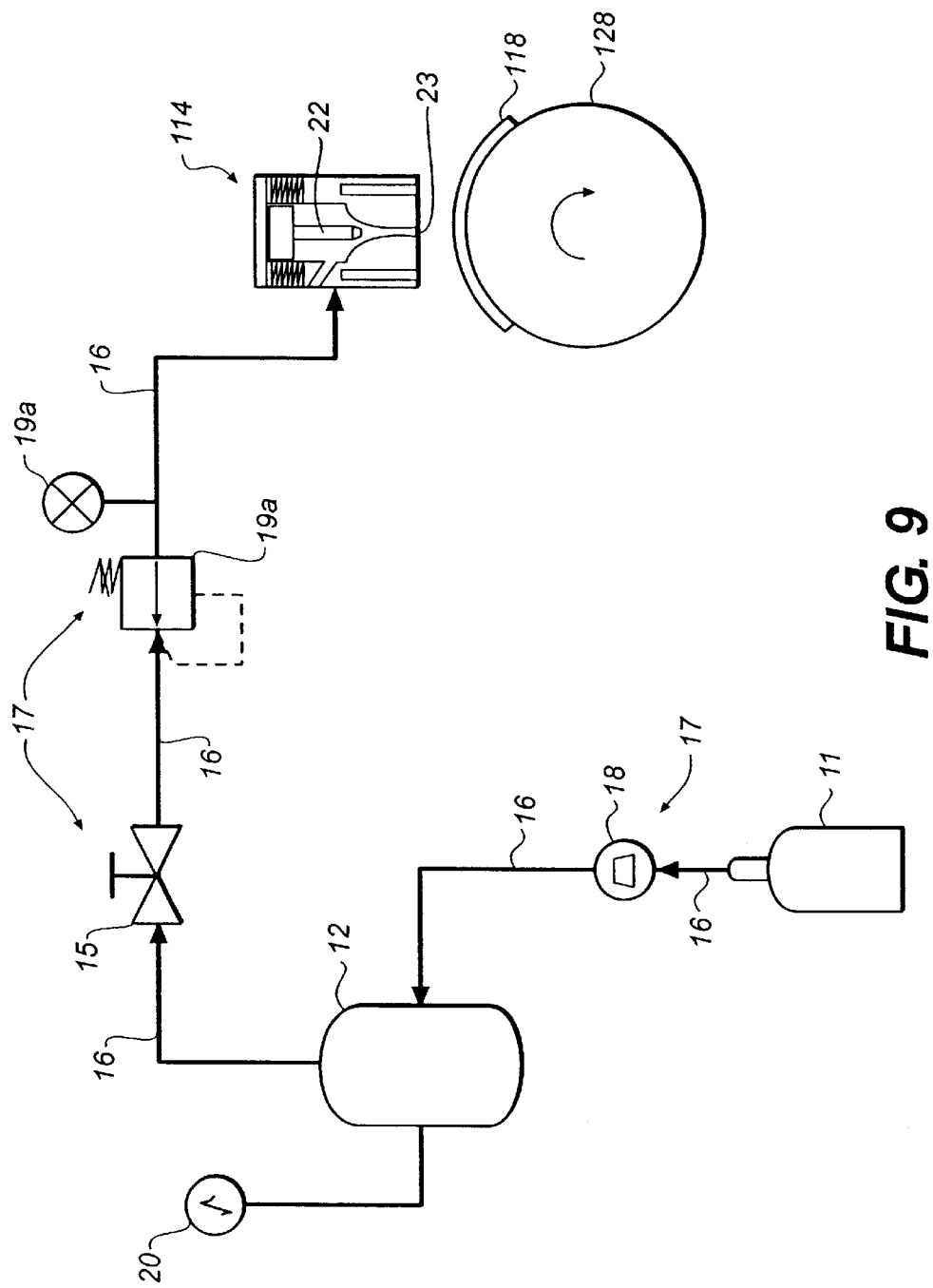
FIGS. 9–12, 14, and 15 are schematic views of alternative embodiments of the delivery system made in accordance with the present invention.
Figure 10:
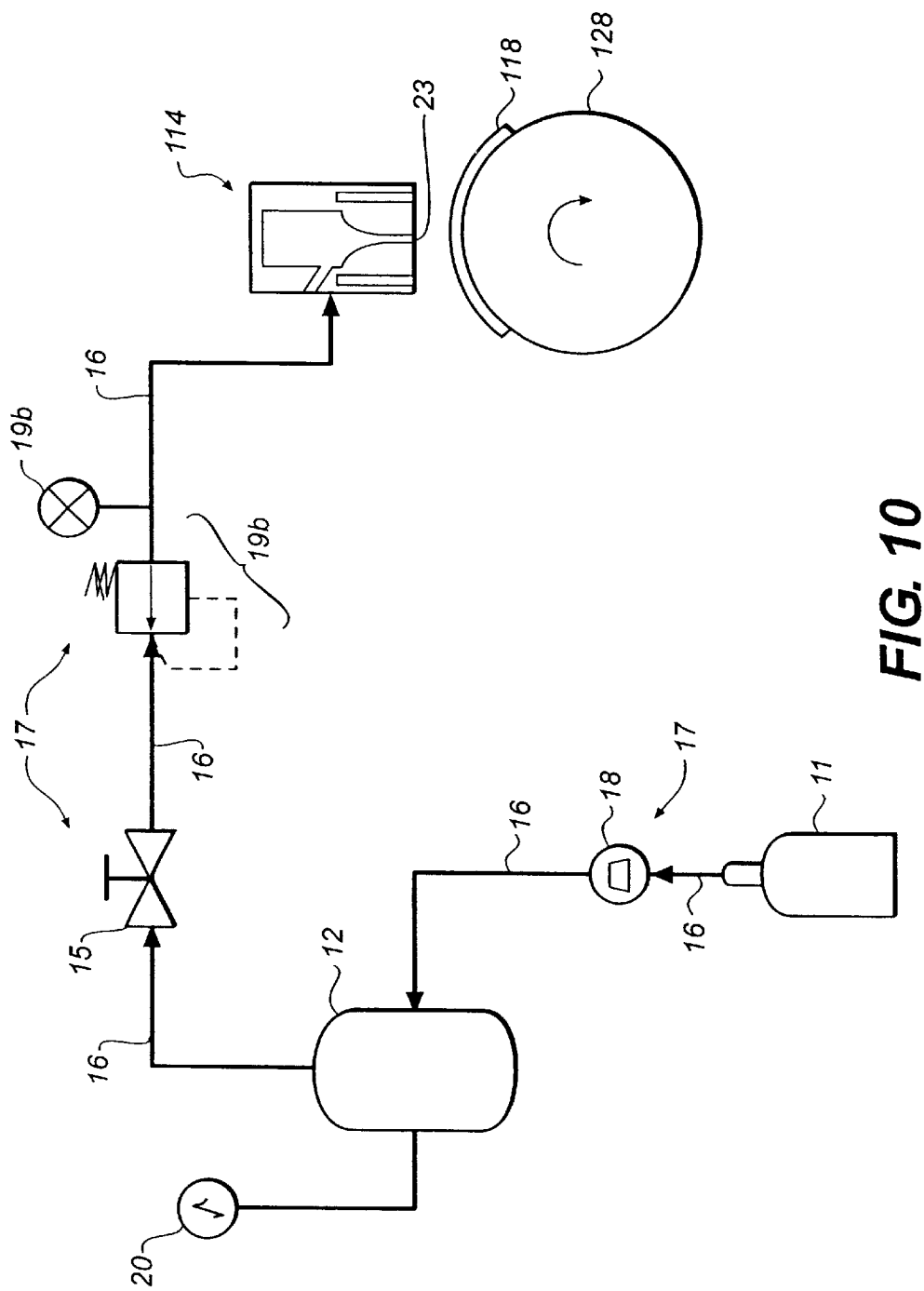

Referring to FIGS. 9 and 10, a pressure control mechanism 17 is positioned along the delivery path 16. The pressure control mechanism 17 is used to create and maintain a desired pressure required for a particular application. The pressure control mechanism 17 can include a pump 18, a valve(s) 15, and a pressure regulator 19a, as shown in FIG. 9. Alternatively, the pressure control mechanism 17 can include a pump 18, a valve(s) 15, and a multi-stage pressure regulator 19b, as shown in FIG. 10. Additionally, the pressure control mechanism 17 can include alternative combinations of pressure controlling devices, etc. For example, the pressure control mechanism 17 can include additional valve(s) 15, actuators to regulate fluid/formulation flow, variable volume devices to change system operating pressure, etc., appropriately positioned along the delivery path 16. Typically, the pump 18 is positioned along the delivery path 16 between the fluid source 11 and the formulation reservoir 12. The pump 18 can be a high pressure pump that increases and maintains system operating pressure, etc. The pressure control mechanism 17 can also include any number of monitoring devices, gauges, etc., for monitoring the pressure of the delivery system 10.

A temperature control mechanism 20 is positioned along delivery path 16 in order to create and maintain a desired temperature for a particular application. The temperature control mechanism 20 is preferably positioned at the formulation reservoir 12. The temperature control mechanism 20 can include a heater, a heater including electrical wires, a water jacket, a refrigeration coil, a combination of temperature controlling devices, etc. The temperature control mechanism 20 can also include any number of monitoring devices, gauges, etc., for monitoring the temperature of the delivery system 10.

The nozzle 114 positioned to provide directed delivery of the formulation towards the receiver 118. The nozzle 114 can also include a shutter 22 to regulate the flow of the compressed fluid and functional material mixture or formulation. The shutter 22 regulates flow of the formulation in a predetermined manner (i.e. on/off or partial opening operation at desired frequency, etc.). The shutter 22 can be manually, mechanically, pneumatically, electrically or electronically actuated. Alternatively, the discharge device 13 does not have to include the shutter 22 (shown in FIG. 10). As the mixture is under higher pressure, as compared to ambient conditions, in the delivery system 10, the mixture will naturally move toward the region of lower pressure, the area of ambient conditions. In this sense, the delivery system 10 is said to be self-energized.

Figure 11:
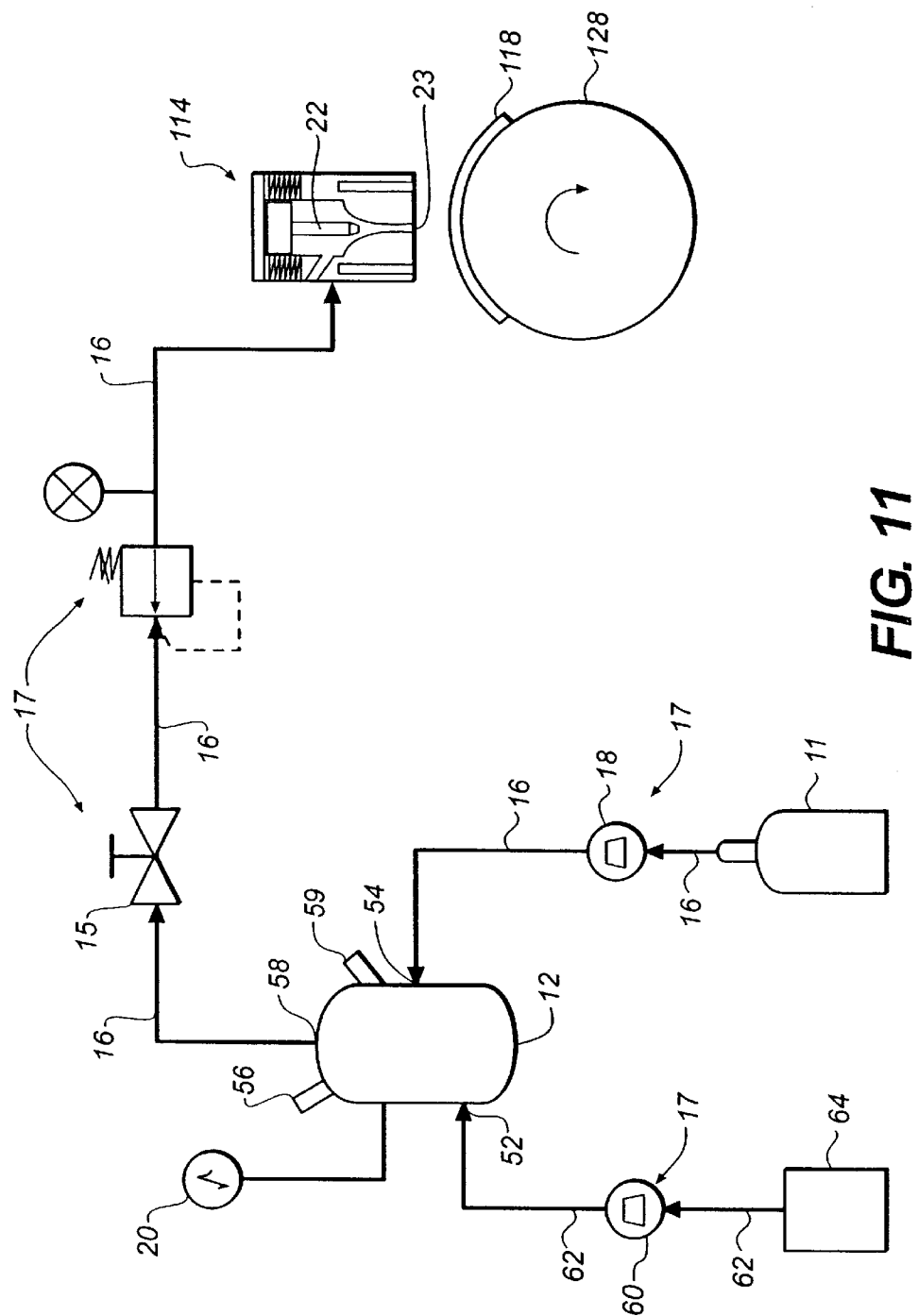

Referring to FIG. 11, the formulation reservoir 12 can be a pressurized vessel having appropriate inlet ports 52, 54, 56 and outlet ports 58. Inlet ports 52, 54, 56 can be used as an inlet for functional material 52 and an inlet for compressed fluid 54. Alternatively, inlet port 56 can be used to manually add functional material to the formulation reservoir 12. Outlet port 58 can be used as an outlet for the mixture of functional material and compressed fluid.

When automated delivery of the functional material is desired, a pump 60 is positioned along a functional material delivery path 62 between a source of functional material 64 and the formulation reservoir 12. The pump 60 pumps a desired amount of functional material through inlet port 52 into the formulation reservoir 12. The formulation reservoir 12 can also include additional inlet/outlet ports 59 for inserting or removing small quantities of functional material or functional material and compressed fluid mixtures.

Figure 12:
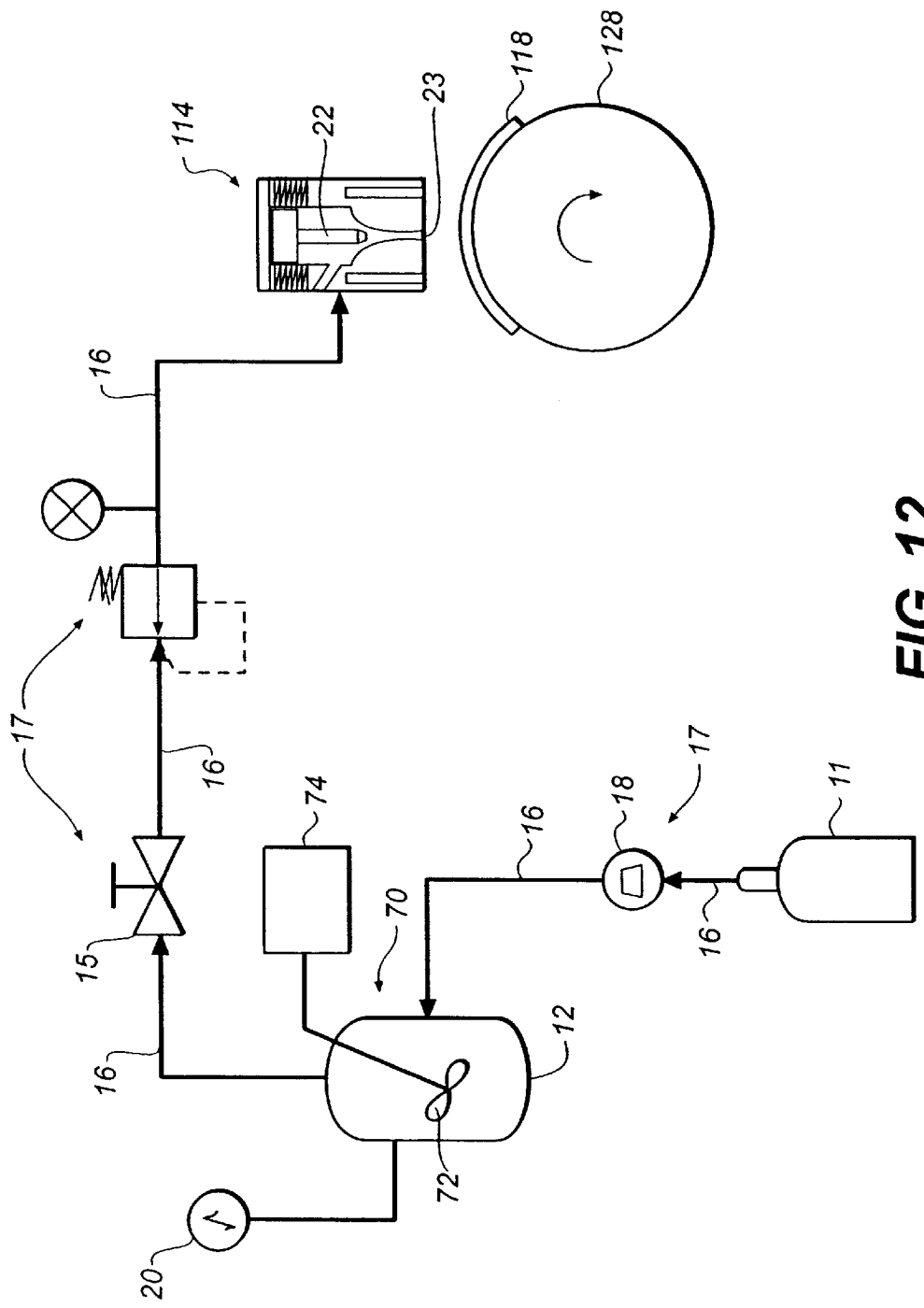

Referring to FIG. 12, the formulation reservoir 12 can include a mixing device 70 used to create the mixture of functional material and compressed fluid. Although typical, a mixing device 70 is not always necessary to make the mixture of the functional material and compressed fluid depending on the type of functional material and the type of compressed fluid. The mixing device 70 can include a mixing element 72 connected to a power/control source 74 to ensure that the functional material disperses into or forms a solution with the compressed fluid. The mixing element 72 can be an acoustic, a mechanical, and/or an electromagnetic element.

Referring back to FIGS. 9–12, and referring to FIGS. 13A–13J, the formulation reservoir 12 can also include suitable temperature control mechanisms 20 and pressure control mechanisms 17 with adequate gauging instruments to detect and monitor the temperature and pressure conditions within the reservoir, as described above. For example, the formulation reservoir 12 can include a moveable piston device 76, etc., to control and maintain pressure. The formulation reservoir 12 can also be equipped to provide accurate control over temperature within the reservoir. For example, the formulation reservoir 12 can include electrical heating/cooling zones 78, using electrical wires 80, electrical tapes, water jackets 82, other heating/cooling fluid jackets, refrigeration coils 84, etc., to control and maintain temperature. The temperature control mechanisms 20 can be positioned within the formulation reservoir 12 or positioned outside the formulation reservoir. Additionally, the temperature control mechanisms 20 can be positioned over a portion of the formulation reservoir 12, throughout the formulation reservoir 12, or over the entire area of the formulation reservoir 12.

Figure 13A:
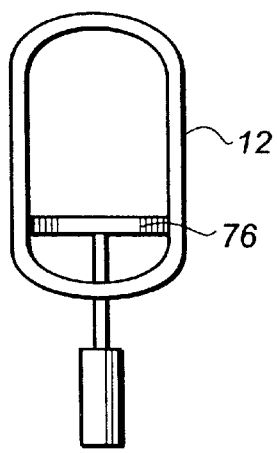
FIGS. 13A–13K are cross sectional views of a portion of the delivery system made in accordance with the present invention.
Figure 13B:
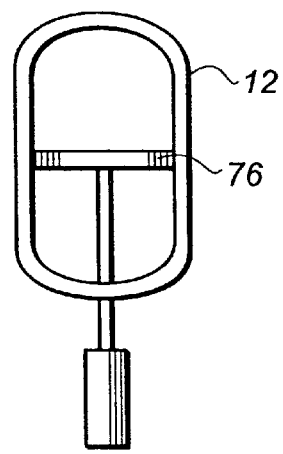
Figure 13C:
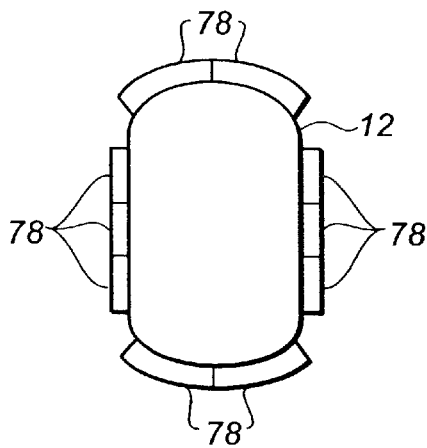
Figure 13D:
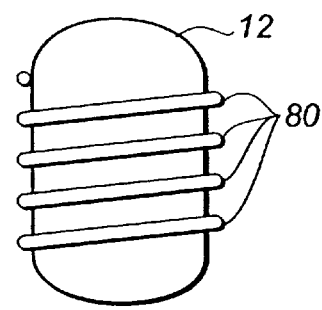
Figure 13E:
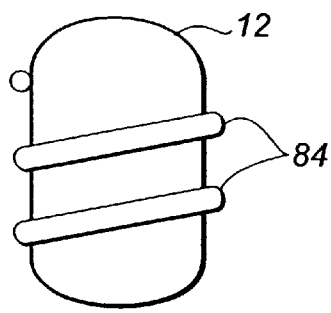
Figure 13F:
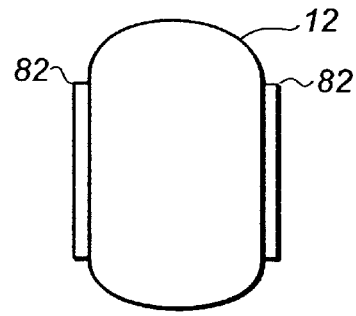
Figure 13G:
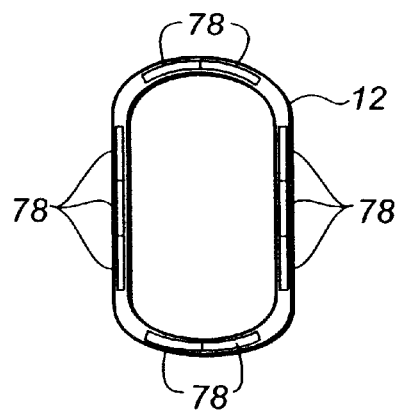
Figure 13H:
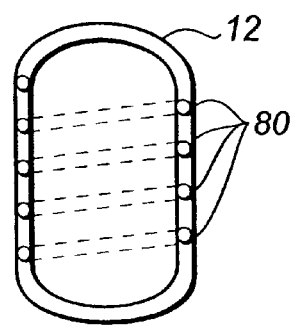
Figure 13I:
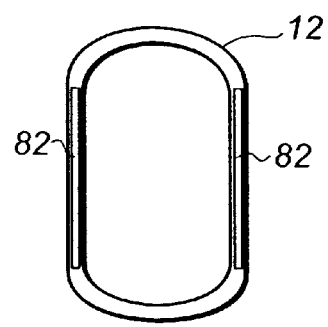
Figure 13J:
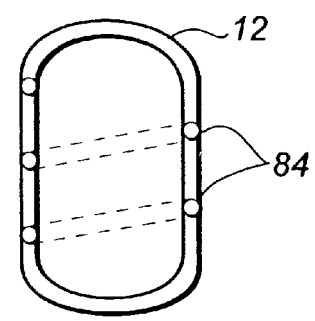
Figure 13K:
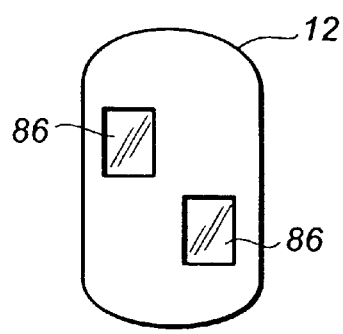

Referring to FIG. 13K, the formulation reservoir 12 can also include any number of suitable high-pressure windows 86 for manual viewing or digital viewing using an appropriate fiber optics or camera set-up. The windows 86 are typically made of sapphire or quartz or other suitable materials that permit the passage of the appropriate frequencies of radiation for viewing/detection/analysis of reservoir contents (using visible, infrared, X-ray etc. viewing/detection/analysis techniques), etc.

The formulation reservoir 12 is made of appropriate materials of construction in order to withstand high pressures of the order of 10,000 psi or greater. Typically, stainless steel is the preferred material of construction although other high-pressure metals, metal alloys, and/or metal composites can be used.

Figure 14:
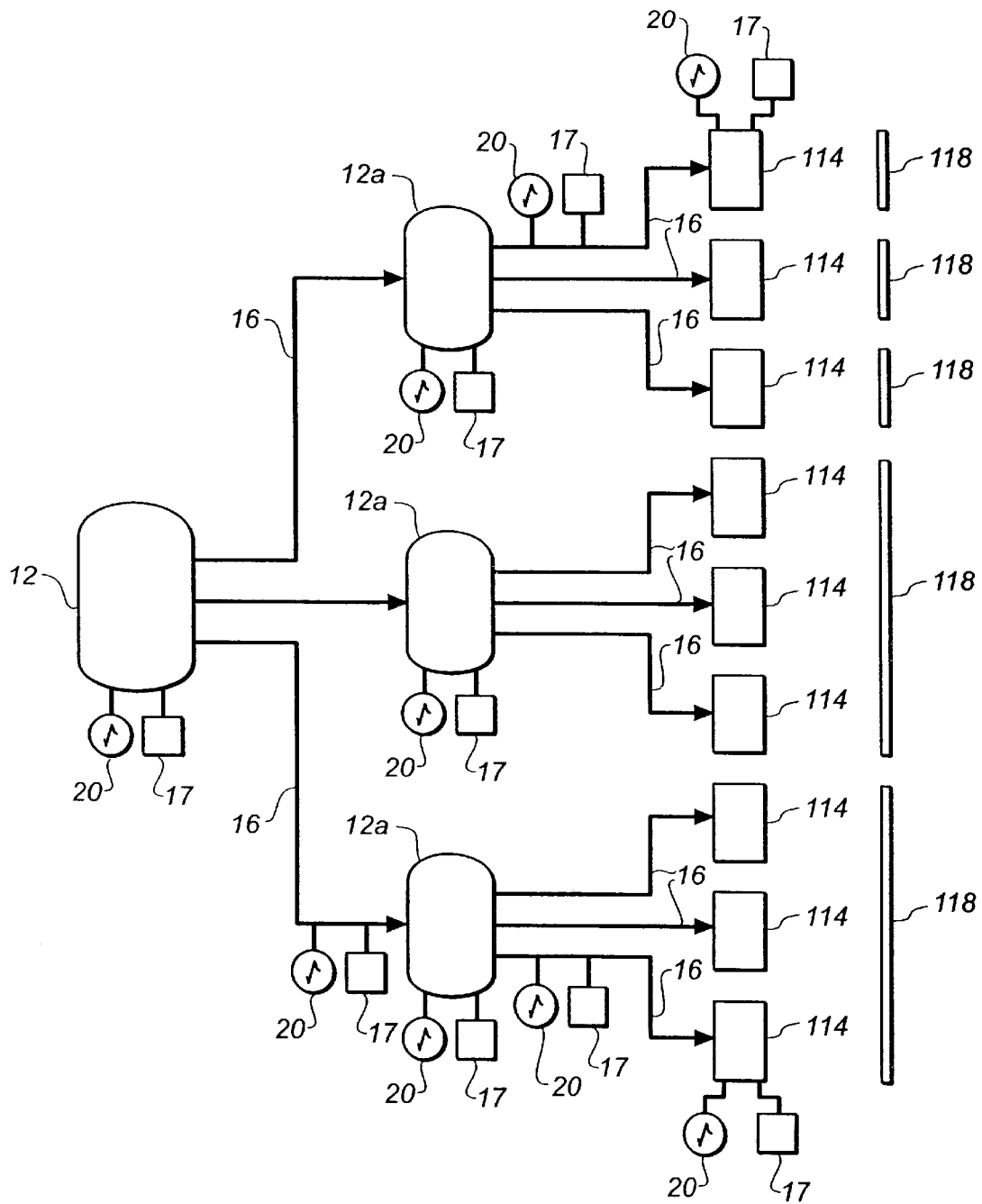

Referring to FIG. 14, in an alternative arrangement, the thermodynamically stable/metastable mixture of functional material and compressed fluid can be prepared in one formulation reservoir 12 and then transported to one or more additional formulation reservoirs 12*a*. For example, a single large formulation reservoir 12 can be suitably connected to one or more subsidiary high-pressure vessels 12*a* that maintain the functional material and compressed fluid mixture at controlled temperature and pressure conditions with each subsidiary high pressure vessel 12*a* feeding one or more nozzles 114. Either or both reservoirs 12 and 12*a* can be equipped with the temperature control mechanism 20 and/or pressure control mechanisms 17. The nozzle 114 can direct the mixture towards a single receiver 118 or a plurality of receivers 118.

Figure 15:
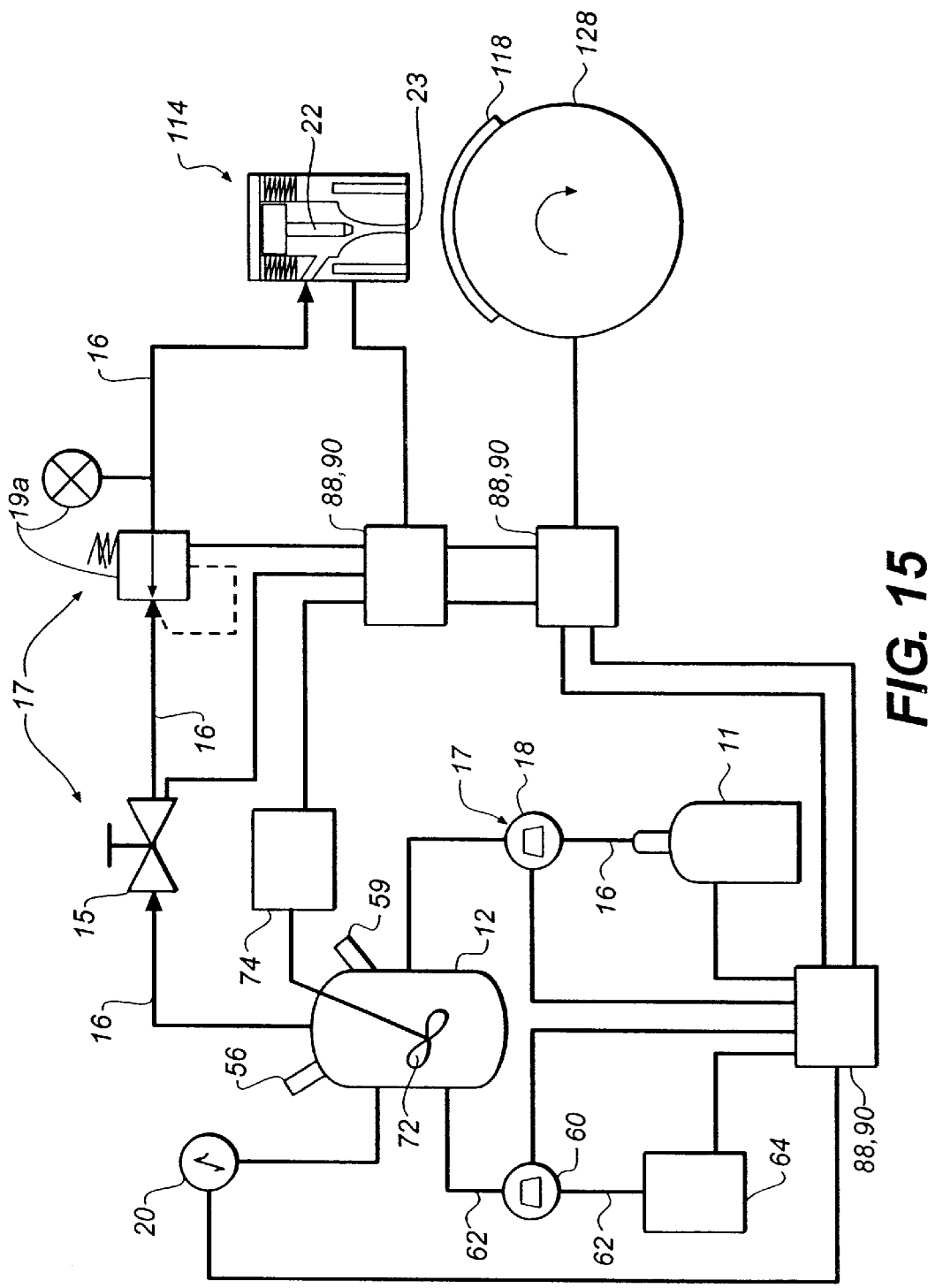

Referring to FIG. 15, the delivery system 10 can include ports for the injection of suitable functional material, view cells, and suitable analytical equipment such as Fourier Transform Infrared Spectroscopy, Light Scattering, Ultra-Violet or Visible Spectroscopy, etc. to permit monitoring of the delivery system 10 and the components of the delivery system. Additionally, the controller 122 can include any number of control devices 88, microprocessors 90, etc., used to control the delivery system 10.

Figure 16:
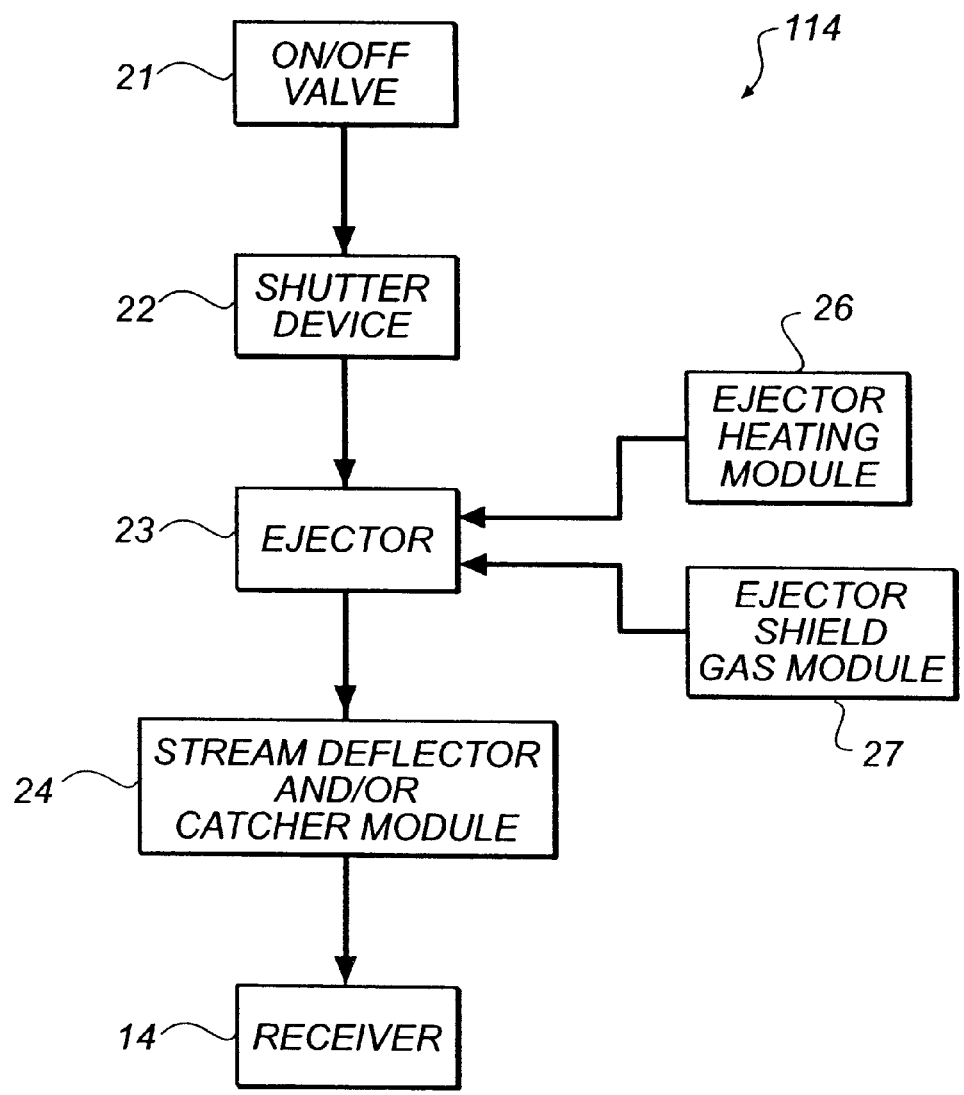
FIG. 16 is a block diagram of a nozzle made in accordance with the present invention.

Referring to FIG. 16, the nozzle 114 is described in more detail. The nozzle 114 can include an on/off valve 21 that can be manually or automatically actuated to regulate the flow of the compressed fluid. The nozzle 114 includes a shutter device 22 which can also be a programmable valve. The shutter device 22 is capable of being controlled to turn off the flow and/or turn on the flow so that the flow of formulation occupies all or part of the available cross-section of the nozzle 114. Additionally, the shutter device is capable of being partially opened or closed in order to adjust or regulate the flow of formulation. The nozzle 114 also includes an ejector 23. The ejector 23 can be provided, as necessary, with an ejector heating module 26 and an ejector shield gas module 27 to assist in stream collimation. The nozzle 114 also includes a stream deflector and/or catcher module 24 to assist in stream collimation prior to the stream reaching receiver 118. Components 22–24, 26, and 27 of nozzle 114 are located relative to delivery path 16 such that the formulation continues along delivery path 16.

Alternatively, the shutter device 22 can be positioned after the ejector heating module 26 and the ejector shield gas module 27 or between the ejector heating module 26 and the ejector shield gas module 27. Additionally, the ejector shield gas module 27 may not be required for certain applications, as is the case with the stream deflector and catcher module 24. Alternatively, nozzle 114 can include a stream deflector and catcher module 24 and not include the shutter device 22. In this situation, the stream deflector and catcher module 24 can be moveably positioned along delivery path 16 and used to regulate the flow of formulation such that a continuous flow of formulation exits while still allowing for discontinuous deposition and/or etching.

The nozzle 114 can be capable of translation in x, y, and z directions to permit suitable discontinuous and/or continuous functional material deposition and/or etching on the receiver 118, as described above. Translation of the nozzle 114 can be achieved through manual, mechanical, pneumatic, electrical, electronic or computerized control mechanisms. Receiver 118 and/or controllable platform 120 can also be capable of translation in x, y, and z directions to permit suitable functional material deposition and/or etching on the receiver 118. Alternatively, both the receiver 118 and the nozzle 114 can be translatable in x, y, and z directions depending on the particular application.

Figure 17:
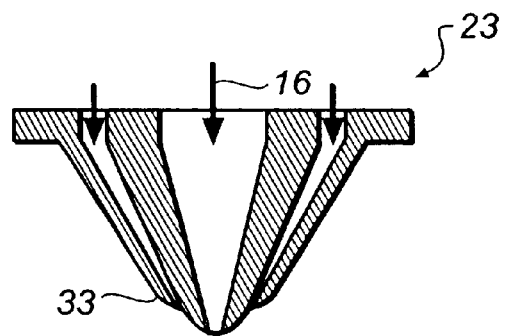
FIGS. 17–19 are cross sectional views of a nozzle portion of the device show in FIG. 16, and FIGS. 20A–20D are schematic diagrams showing the operation of the present invention.
Figure 18:
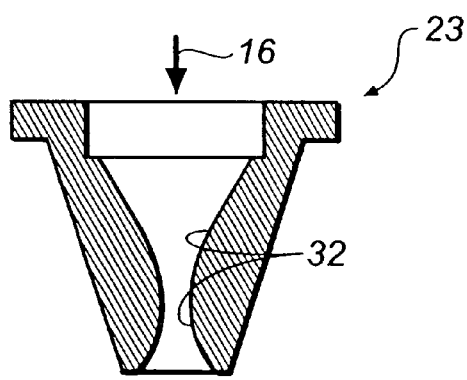
Figure 19:
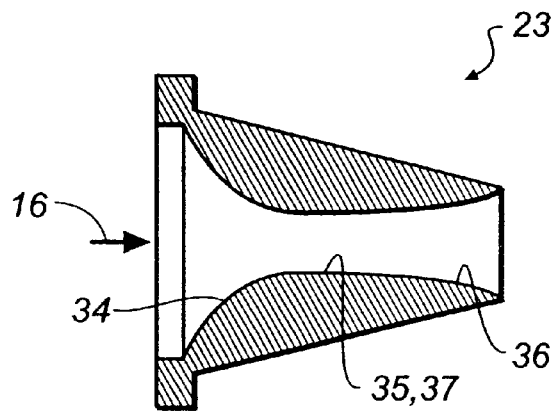

Referring to FIGS. 17–19, the ejector 23 functions to direct the formulation flow towards the receiver 118. It is also used toattenuate the final velocity with which the functional material impinges on the receiver 118. Accordingly, ejector geometry can vary depending on a particular application. For example, ejector geometry can be a constant area having a predetermined shape (cylinder, square, triangular, etc. not shown), variable area converging, variable area diverging, or variable area converging-diverging 32, with various forms of each available through altering the angles of convergence and/or divergence. Alternatively, a combination of a constant area with a variable area, for example, a converging-diverging nozzle with a tubular extension, etc., can be used. In addition, the ejector 23 can be coaxial, axisymmetric, asymmetric, or any combination thereof (shown generally at 33). The shapes of the ejector 23 can assist in regulating the flow of the formulation. In a preferred embodiment of the present invention, the ejector 23 includes a converging section or module 34, a throat section or module 35, and a diverging section or module 36. The throat section or module 35 of the ejector 23 can have a straight section or module 37.

The nozzle 114 serves to direct the functional material onto the receiver 118. The nozzle 114 or a portion of the nozzle 114 can be stationary or can swivel or raster, as needed, to provide high resolution and high precision deposition of the functional material onto the receiver 118 or etching of the receiver 118 by the functional material. Alternatively, receiver 118 can move in a predetermined way while nozzle 114 remains stationary, as described above. The shutter device 22 can also be positioned after the ejector 23. As such, the shutter device 22 and the ejector 23 can be separate devices so as to position the shutter 22 before or after the ejector 23 with independent controls for maximum deposition and/or etching flexibility. Alternatively, the shutter device 22 can be integrally formed within the ejector 23.

Figure 20B:
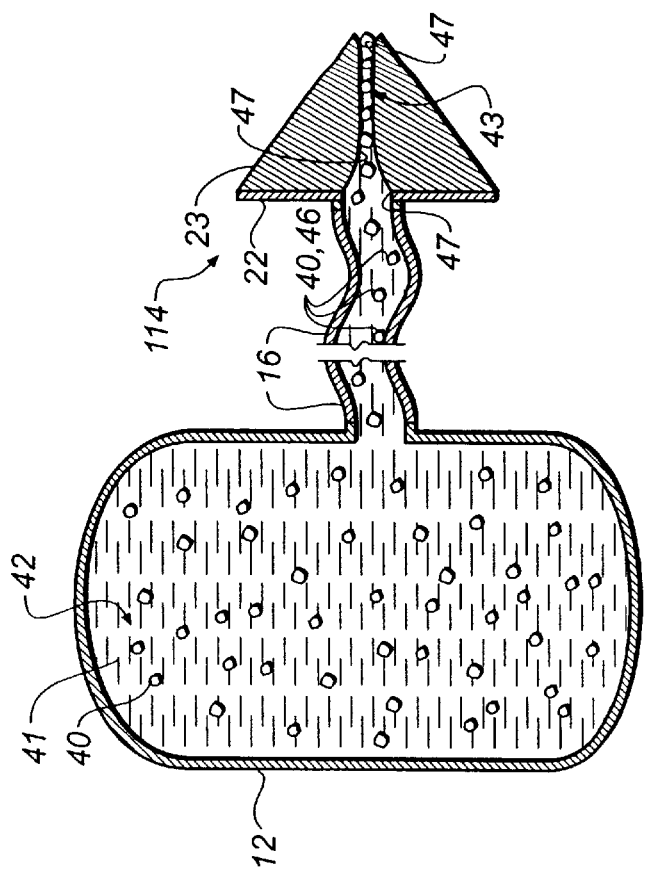
Figure 20A:
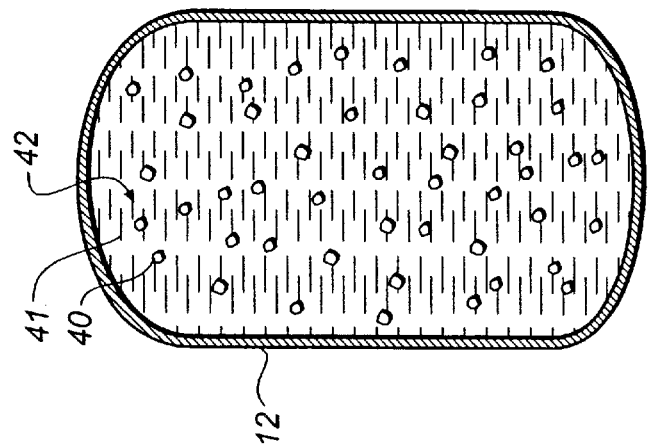
Figure 20C:
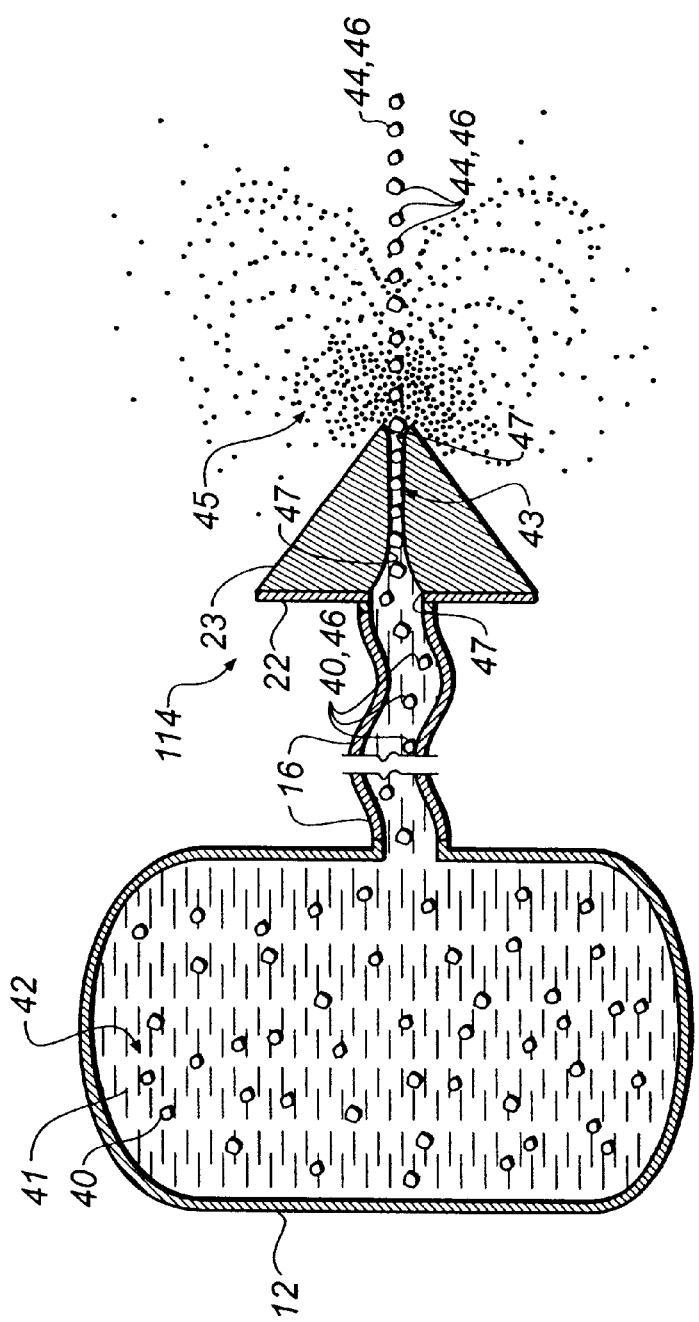
Figure 20D:
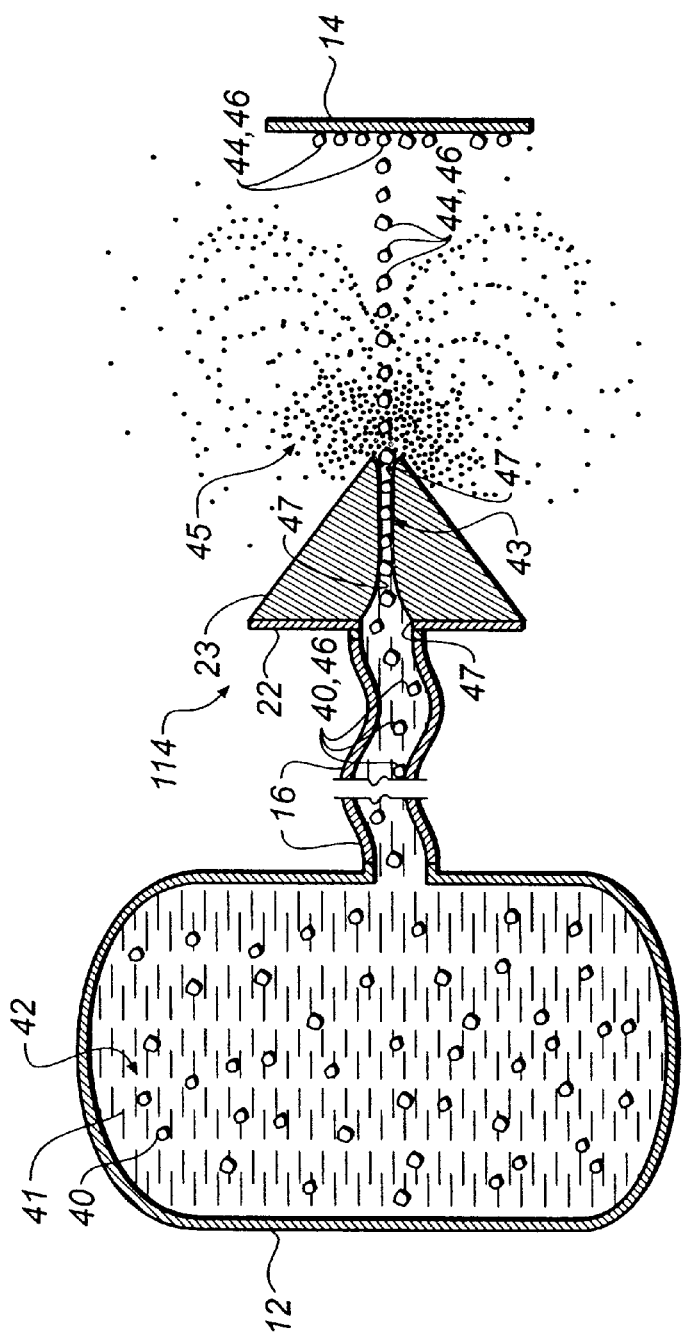

Operation of the delivery system 10 will now be described. FIGS. 20A–20D are diagrams schematically representing the operation of delivery system 10 and should not be considered as limiting the scope of the invention in any manner. A formulation 42 of functional material 40 in a compressed fluid 41 is prepared in the formulation reservoir 12. A functional material 40, any material of interest in solid or liquid phase, can be dispersed (as shown in FIG. 20A) and/or dissolved in a compressed fluid 41 making a mixture or formulation 42. The functional material 40 can have various shapes and sizes depending on the type of the functional material 40 used in the formulation.

The compressed fluid 41, forms a continuous phase and functional material 40 forms a dispersed and/or dissolved single phase. The formulation 42 (the functional material 40 and the compressed fluid 41) is maintained at a suitable temperature and a suitable pressure for the functional material 40 and the compressed fluid 41 used in a particular application. The shutter 22 is actuated to enable the ejection of a controlled quantity of the formulation 42. The ejector 23 collimates and/or focuses the formulation 42 into a stream 43.

The functional material 40 is controllably introduced into the formulation reservoir 12. The compressed fluid 41 is also controllably introduced into the formulation reservoir 12. The contents of the formulation reservoir 12 are suitably mixed using mixing device 70 to ensure intimate contact between the functional material 40 and compressed liquid/supercritical fluid 41. As the mixing process proceeds, functional material 40 is dissolved or dispersed within the compressed fluid 41. The process of dissolution/dispersion, including the amount of functional material 40 and the rate at which the mixing proceeds, depends upon the functional material 40 itself, the particle size and particle size distribution of the functional material 40 (if the functional material 40 is a solid), the compressed fluid 41 used, the temperature, and the pressure within the formulation reservoir 12. When the mixing process is complete, the mixture or formulation 42 of functional material and compressed fluid is thermodynamically stable/metastable in that the functional material is dissolved or dispersed within the compressed fluid in such a fashion as to be indefinitely contained in the same state as long as the temperature and pressure within the formulation chamber are maintained constant. This state is distinguished from other physical mixtures in that there is no settling, precipitation, and/or agglomeration of functional material particles within the formulation chamber unless the thermodynamic conditions of temperature and pressure within the reservoir are changed. As such, the functional material 40 and compressed liquid/supercritical fluid 41 mixtures or formulations 42 of the present invention are said to be thermodynamically stable/metastable.

The functional material 40 can be a solid or a liquid. Additionally, the functional material 40 can be an organic molecule, a polymer molecule, a metallo-organic molecule, an inorganic molecule, an organic nanoparticle, a polymer nanoparticle, a metallo-organic nanoparticle, an inorganic nanoparticle, an organic microparticles, a polymer microparticle, a metallo-organic microparticle, an inorganic microparticle, and/or composites of these materials, etc. After suitable mixing with the compressed liquid/supercritical fluid 41 within the formulation reservoir 12, the functional material 40 is uniformly distributed within a thermodynamically stable/metastable mixture, that can be a solution or a dispersion, with the compressed fluid 41. This thermodynamically stable/metastable mixture or formulation 42 is controllably released from the formulation reservoir 12 through the nozzle 114.

During the discharge process, the functional material 40 is precipitated from the compressed fluid 41 as the temperature and/or pressure conditions change. The precipitated functional material 44 is directed towards a receiver 118 by the nozzle 114 as a focused and/or collimated stream. The particle size of the functional material 40 deposited on the receiver 14 is typically in the range from one nanometer to 1000 nanometers. The particle size distribution may be controlled to be uniform by controlling the rate of change of temperature and/or pressure in the nozzle 114, the location of the receiver 118 relative to the nozzle 114, and the ambient conditions outside of the nozzle 114.

The delivery system 10 is also designed to appropriately change the temperature and pressure of the formulation 42 to permit a controlled precipitation and/or aggregation of the functional material 40. As the pressure is typically stepped down in stages, the formulation 42 fluid flow is self-energized. Subsequent changes to the formulation 42 conditions (a change in pressure, a change in temperature, etc.) result in the precipitation and/or aggregation of the functional material 40 coupled with an evaporation (shown generally at 45) of the supercritical fluid and/or compressed liquid 41. The resulting precipitated and/or aggregated functional material 44 deposits on the receiver 118 in a precise and accurate fashion. Evaporation 45 of the compressed fluid 41 can occur in a region located outside of the nozzle 114. Alternatively, evaporation 45 of compressed fluid 41 can begin within the nozzle 114 and continue in the region located outside the nozzle 114. Alternatively, evaporation 45 can occur within the nozzle 114.

A stream 43 of the functional material 40 and the compressed fluid 41 is formed as the formulation 42 moves through the nozzle 114. When the size of the precipitated and/or aggregated functional material 44 is substantially equal to an exit diameter of the ejector 23 of the nozzle 114, the precipitated and/or aggregated functional material 44 has been collimated by the ejector 23. When the size of the precipitated and/or aggregated functional material 44 is less than the exit diameter of the ejector 23 of the nozzle 114, the precipitated and/or aggregated functional material 44 has been focused by the ejector 23.

The receiver 118 is positioned along the path 16 such that the precipitated and/or aggregated functional material 44 is deposited on the receiver 118. As the individual particle size of the precipitated and/or aggregated functional material 44 is extremely small, adhesion forces are sufficient to keep the particles in place on the receiver 118.

The distance of the receiver 118 from the nozzle 114 is chosen such that the compressed fluid 41 evaporates from the compressed fluid to the gas phase (shown generally at 45) prior to reaching the receiver 118. Hence, there is no need for subsequent receiver-drying processes. Further, subsequent to the ejection of the formulation 42 from the nozzle 114 and the precipitation of the functional material, additional focusing and/or collimation may be achieved using external devices such as electro-magnetic fields, mechanical shields, magnetic lenses, electrostatic lenses etc. Alternatively, the receiver 118 can be electrically or electrostatically charged such that the position of the functional material 40 can be controlled.

It is also desirable to control the velocity with which individual particles 46 of the functional material 40 are ejected from the nozzle 114. As there is a sizable pressure drop from within the delivery system 10 to the operating environment, the pressure differential converts the potential energy of the delivery system 10 into kinetic energy that propels the functional material particles 46 onto the receiver 118. The velocity of these particles 46 can be controlled by suitable nozzle design and control over the rate of change of operating pressure and temperature within the system. Further, subsequent to the ejection of the formulation 42 from the nozzle 114 and the precipitation of the functional material 40, additional velocity regulation of the functional material 40 may be achieved using external devices such as electromagnetic fields, mechanical shields, magnetic lenses, electrostatic lenses etc. Nozzle design and location relative to the receiver 118 also determine the pattern of functional material 40 deposition. The actual nozzle design will depend upon the particular application addressed.

The nozzle 114 temperature can also be controlled. Nozzle temperature control may be controlled as required by specific applications to ensure that the nozzle opening 47 maintains the desired fluid flow characteristics. Nozzle temperature can be controlled through the nozzle heating module 26 using a water jacket, electrical heating techniques, etc. With appropriate nozzle design, the exiting stream temperature can be controlled at a desired value by enveloping the exiting stream with a co-current annular stream of a warm or cool, inert gas, as shown in FIG. 17.

The receiver 118 is a solid typically made from an organic, an inorganic, a metallo-organic, a metallic, an alloy, a ceramic, a synthetic and/or natural polymer, a gel, a glass, and a composite material. The receiver 118 can be porous or non-porous and comprise a single layer or a plurality of layers. When the receiver 118 has a plurality of layers, several techniques can be used to create additional layers (e.g. coating, co-extrusion, lamination, deposition, etc.).

The location and accuracy of deposition of the functional material 40 onto or into the receiver 118 is dependent upon the application. For example, in certain printing applications it may be desirable for the functional material 40, if the functional material 40 is a dye particle, to be deposited on the receiver surface for maximum optical density of the resulting image. In other printing applications, it may be desirable to locate the functional material 40 close to but not at the receiver surface in order to improve image light-fastness and image water-fastness of the resulting image. In other imaging applications, it may be desirable to locate the functional material 40 significantly below the surface to retain maximum receiver gloss and create special image effects (e.g. pearlescence, limited angle-viewing properties, etc.).

The deposition characteristics of the functional material 40 are a function of several factors including the bulk modulus of the receiver 118, the bulk modulus of the functional material 40, density of the receiver 118, the density of the functional material 40, the pressure-difference between the formulation reservoir and ambient conditions, the temperature difference between the formulation reservoir and ambient conditions, the deposition time, the discharge nozzle geometry, the distance between the discharge nozzle and the receiver, functional material size and momentum, etc. These factors can be modified or held constant depending on the application. For example, in a printing application wherein the functional material 40 is to be deposited on the receiver surface, the nozzle geometry, formulation conditions, ambient conditions, and functional material can be fixed. The deposition of the functional material 40 can then be controlled by altering the receiver design (e.g. the bulk modulus of the receiver, the distance between the discharge nozzle and the receiver, the deposition time, etc.). Alternatively, for the same application, it is possible to alter formulation conditions (e.g. functional material concentration, etc.). Alternatively, for a printing application wherein the functional material 40 is to be deposited within the receiver, the deposition can be controlled by altering the receiver design (e.g. the bulk modulus of the receiver, formulation conditions, etc.), while keeping the other parameters fixed.

For a given constant nozzle geometry, constant conditions within the formulation reservoir, unchanging ambient conditions, constant deposition time, and a constant distance between the tip of the discharge nozzle and the receiver, the main receiver property that governs the accuracy of deposition of the functional material 40 is the receiver bulk modulus relative to the functional material bulk modulus. The bulk modulus of a material, typically expressed in Pascals, is a measure of its compressibility or its ability to absorb the momentum of a particle. Specifically, it is a measure of the change in volume of the material as the pressure is changed. It may be expressed isothermally or adiabatically. The isothermal bulk modulus is specified in this application.

The receiver can be a single layer or multi-layer receiver having one or more layers with a bulk modulus of between 10 Mpa and 100 GPa positioned at a distance between 0.01 cm and 25 cm from the nozzle of the discharge device.

The choice of receiver bulk modulus also depends on the functional material bulk modulus. With all other parameters held constant, if the receiver bulk modulus is significantly larger than that of the functional material, it can be reasonably expected that the functional material particles are significantly altered in shape upon impact with the receiver 118. Alternatively, when the functional material bulk modulus is much higher than that of the receiver, the functional material particles may retain much of their original shape even after impact with the receiver 118.

The receiver 118 can comprise multiple layers of varying bulk moduli. In applications in which the functional material 40 is to be located in a layer other than in the top layer, receiver layers of varying bulk moduli may be selected and layered in such a fashion as to allow the functional material 40 to penetrate through the top layer or layers and into the layer of choice.

Other properties of the receiver 118 have to be considered depending on the application for broad consumer acceptance. These properties (e.g. basis weight, caliper, stiffness, smoothness, gloss, whiteness, opacity, etc.) should lie within a narrow range of values for broad consumer acceptance. These property concerns can be addressed when developing receiver designs incorporating one or more layers having a bulk modulus within the specified range for controlling the depth of deposition of the functional material 40.

The invention has been described in detail with particular reference to certain preferred embodiments thereof, but it will be understood that variations and modifications can be effected within the scope of the invention.

What is claimed is:

1. A system for delivering a functional material on a receiver, comprising:
    a chamber containing fluid in a compressed state, the fluid including a solvent and suspension of the functional material to be deposited on the receiver, the chamber having a controllable nozzle for the ejection of a stream of the fluid toward the receiver;
    a controllable platform for locating and orienting the receiver with respect to the controllable nozzle; and
    a controller operably connected to the controllable nozzle and the controllable platform thereby controlling the ejection of the compressed fluid through the controllable nozzle and controlling the location of the receiver with respect to the controllable nozzle, wherein the functional material becomes free of the solvent prior to the functional material contacting the receiver.

2. The system claimed in claim 1, wherein the controllable platform changes the location of the receiver with respect to the controllable nozzle by moving the receiver.

3. The system claimed in claim 1, wherein the controllable platform changes the location of the receiver with respect to the controllable nozzle by moving the controllable nozzle.

4. The system claimed in claim 1, wherein the controllable platform changes the location of the receiver with respect to the controllable nozzle by moving both the receiver and the controllable nozzle.

5. The system claimed in claim 2, wherein the receiver has a planar surface and the controllable platform moves the receiver in two dimensions orthogonally to the stream of functional material.

6. The system claimed in claim 3, wherein the receiver has a planar surface and the controllable platform moves the controllable nozzle in two dimensions orthogonally to the stream of functional material.

7. The system claimed in claim 4, wherein the receiver has a planar surface and the controllable platform moves the controllable nozzle in one dimension orthogonally to the stream of functional material and the controllable platform moves the receiver in a second dimension orthogonally to both the stream of functional material and the movement of the controllable nozzle.

8. The system claimed in claim 2, wherein the receiver has a curved cylindrical shape and a center of curvature orthogonal to the stream of functional material and the controllable platform rotates and translates the receiver about and along the center of curvature.

9. The system claimed in claim 4, wherein the receiver has a curved cylindrical shape and a center of curvature is orthogonal to the stream of functional material and the controllable platform rotates the receiver about the center of curvature and translates the controllable nozzle in a direction parallel to the center of curvature of the receiver.

10. The system claimed in claim 2, wherein the receiver has a arbitrarily curved surface and the controllable platform rotates and translates the receiver so that the stream of functional material contacts the receiver orthogonally.

11. The system claimed in claim 10, wherein the receiver is spherically curved and the functional material is deposited on one of an inside surface and an outside surface of the receiver.

12. The system claimed in claim 1, wherein the chamber includes multiple controllable nozzles for simultaneously or sequentially ejecting multiple streams of the functional material.

13. The system claimed in claim 12, wherein the streams of functional material ejected from the multiple controllable nozzles intersect at a common location on the receiver.

14. The system claimed in claim 12, wherein the streams of functional material ejected from the multiple controllable nozzles intersect distinct locations on the receiver.

15. The system claimed in claim 1, wherein multiple layers of functional material are sequentially deposited upon the receiver.

16. The system claimed in claim 1, wherein the receiver is an optical element.

17. The system claimed in claim 16, wherein the optical element is an element of a display or projection system.

18. The system claimed in claim 17, wherein the optical element is a display screen.

19. The system claimed in claim 16, wherein the optical element has a curved surface.

20. The system claimed in claim 1, wherein the functional material deposited on the receiver is an emissive material.

21. The system claimed in claim 20, wherein the emissive material is an organic light emitting material.

22. The system claimed in claim 1, wherein the controllable platform moves the receiver with respect to the controllable nozzle concurrently with a continuous ejection of functional material.

23. The system claimed in claim 1, wherein the controllable platform moves in a first direction simultaneously as the controllable nozzle moves in a second direction.

24. The system claimed in claim 2, wherein the receiver has a arbitrarily curved surface and the controllable platform rotates and translates the receiver so that the stream of functional material contacts the receiver at an angle other than orthogonally.

25. The system claimed in claim 1, wherein the controllable platform is a motion platform with three or more degrees of freedom.

26. The system claimed in claim 11 wherein the controllable platform rotates the receiver about a point common with the center of curvature of the receiver and the receiver is located to intersect with the stream of functional material.

27. The system claimed in claim 1 wherein the functional material becomes free of the solvent by moving the compressed fluid from a first predetermined thermodynamic state to a second thermodynamic state.

28. The system claimed in claim 27 wherein the compressed fluid is moved from a first predetermined thermodynamic state to a second thermodynamic state such that the solvent evaporates.

29. The system claimed in claim 27 wherein the compressed fluid is moved from a first predetermined thermodynamic state to a second thermodynamic state by decreasing the pressure of the compressed fluid.

30. The system claimed in claim 27 wherein the compressed fluid is moved from a first predetermined thermodynamic state to a second thermodynamic state by decreasing the temperature of the compressed fluid.

31. The system claimed in claim 1 wherein the receiver has a surface and the functional material penetrates the surface of the receiver.

32. The system claimed in claim 1 wherein the receiver has a plurality of layers and the functional material penetrates and passes through a first layer of the receiver into a second layer of the receiver such that only the second layer contains the functional material.

33. The system claimed in claim 1 wherein the nozzle includes a shutter, the shutter having an open position, wherein the compressed fluid is ejected through nozzle when the shutter is in the open position.

34. The system claimed in claim 33 wherein the nozzle has a plurality of open positions.

35. The system claimed in claim 1, wherein the receiver is flexible.

36. A method of depositing a functional material to a receiver comprising:

providing a chamber containing fluid in a compressed state, the fluid including a solvent and suspension of functional material to be deposited;

providing a controllable nozzle integrated into the chamber for the ejection of the fluid in a stream;

locating one of a receiver and the controllable nozzle with respect to the other of the receiver and the controllable nozzle such that the receiver is positioned to intersect the stream of functional material; and controllably ejecting the fluid through the nozzle, wherein the functional material becomes free of the solvent prior to contacting the receiver.

37. The method according to claim 36, wherein providing the compressed fluid includes providing a mixture of a supercritical fluid and the functional material.

38. The method according to claim 36, the compressed fluid being contained under a predetermined pressure, wherein controllably ejecting the compressed fluid from the nozzle includes decreasing the predetermined pressure.

39. The method according to claim 36, the compressed fluid being contained under a predetermined temperature, wherein controllably ejecting the compressed fluid from the nozzle includes decreasing the predetermined temperature.

40. The method according to claim 36, wherein controllably ejecting the compressed fluid from the nozzle includes opening a shutter for a predetermined amount of time such that depositing the solvent free functional material on the receiver includes the functional material penetrating a surface of the receiver.

41. The method according to claim 36, the receiver having a plurality of layers, wherein controllably ejecting the compressed fluid from the nozzle includes opening the shutter for a predetermined amount of time such that depositing the solvent free functional material on the receiver includes the functional material penetrating and passing through a first layer of the receiver, and penetrating a second layer of the receiver such that only the second layer contains the functional material.

42. The method according to claim 36, the receiver having a layer, wherein controllably ejecting the compressed fluid from the nozzle includes opening a shutter for a predetermined amount of time such that depositing the solvent free functional material on the receiver includes selectively positioning the functional material on the surface of the layer of the receiver.

* * * * *